(12) United States Patent
Fukui et al.

(10) Patent No.: US 11,387,390 B2
(45) Date of Patent: Jul. 12, 2022

(54) METHOD FOR PRODUCING WAVELENGTH CONVERTING MEMBER, AND WAVELENGTH CONVERTING MEMBER

(71) Applicant: NICHIA CORPORATION, Anan (JP)

(72) Inventors: Tomoya Fukui, Tokushima (JP); Tadayoshi Yanagihara, Tokushima (JP)

(73) Assignee: NICHIA CORPORATION, Anan (JP)

( * ) Notice: Subject to any disclaimer, the term of this patent is extended or adjusted under 35 U.S.C. 154(b) by 124 days.

(21) Appl. No.: 16/199,922

(22) Filed: Nov. 26, 2018

(65) Prior Publication Data

US 2019/0165220 A1 May 30, 2019

(30) Foreign Application Priority Data

Nov. 27, 2017 (JP) .............................. JP2017-226616
Feb. 7, 2018 (JP) .............................. JP2018-020159
Nov. 21, 2018 (JP) .............................. JP2018-218630

(51) Int. Cl.
*C09K 11/77* (2006.01)
*H01L 33/50* (2010.01)
(Continued)

(52) U.S. Cl.
CPC .............. *H01L 33/50* (2013.01); *C04B 35/44* (2013.01); *C04B 35/505* (2013.01);
(Continued)

(58) Field of Classification Search
CPC ................... H01L 33/50; H01L 33/504; H01L 2933/0041; H01S 5/0611; C04B 35/597;
(Continued)

(56) References Cited

U.S. PATENT DOCUMENTS 7,902,564 B2 3/2011 Mueller-Mach et al.
8,169,136 B2 5/2012 Nakamura et al.
(Continued)

FOREIGN PATENT DOCUMENTS

EP 1670070 A1 6/2006
JP 2009091546 A 4/2009
(Continued)

OTHER PUBLICATIONS

Machine translation of JP2009091546A, 23 pages. (Year: 2009).
(Continued)

*Primary Examiner* — Audrey Y Chang
(74) *Attorney, Agent, or Firm* — Hunton Andrews Kurth LLP

(57) ABSTRACT

A method for producing a wavelength converting member that emits light under irradiation of excitation light, and a wavelength converting member. The method for producing a wavelength converting member, including: providing a green body prepared by a process comprising molding a mixed powder containing a Ca-α-SiAlON fluorescent material and alumina, and depending on necessity an YAG fluorescent material; and primarily sintering the green body at a temperature in a range of 1,000° C. or more and 1,600° C. or less to obtain a first sintered body.

14 Claims, 4 Drawing Sheets

(51) Int. Cl.
*H01S 5/06* (2006.01)
*C04B 35/622* (2006.01)
*C04B 35/505* (2006.01)
*C04B 35/645* (2006.01)
*C04B 35/44* (2006.01)
*C04B 35/597* (2006.01)
*C04B 35/64* (2006.01)

(52) U.S. Cl.
CPC .......... *C04B 35/597* (2013.01); *C04B 35/622* (2013.01); *C04B 35/64* (2013.01); *C04B 35/6455* (2013.01); *H01S 5/0611* (2013.01); *C04B 2235/3208* (2013.01); *C04B 2235/3217* (2013.01); *C04B 2235/3222* (2013.01); *C04B 2235/3225* (2013.01); *C04B 2235/5436* (2013.01); *C04B 2235/5445* (2013.01); *C04B 2235/604* (2013.01); *C04B 2235/661* (2013.01); *C04B 2235/764* (2013.01); *C04B 2235/77* (2013.01); *H01L 2933/0041* (2013.01)

(58) Field of Classification Search
CPC ......... C04B 35/64; C04B 35/505; F21V 9/32; C09K 11/7774; H05B 33/14
USPC .............................. 313/506, 498, 503; 362/84
See application file for complete search history.

(56) References Cited

U.S. PATENT DOCUMENTS

| | | | |
|---|---|---|---|
| 8,502,442 B2 | 8/2013 | Nakamura et al. | |
| 9,605,201 B2 * | 3/2017 | Yamaguchi | ............... F21V 9/32 |
| 10,267,963 B2 * | 4/2019 | Fujita | .................... H01L 33/504 |
| 2005/0156496 A1 | 7/2005 | Takashima et al. | |
| 2008/0149956 A1 | 6/2008 | Mueller-Mach et al. | |
| 2008/0258110 A1 | 10/2008 | Oshio | |
| 2009/0212697 A1 | 8/2009 | Nakamura et al. | |
| 2009/0284948 A1 * | 11/2009 | Yamao | ............... C09K 11/0883 |
| | | | 362/84 |
| 2011/0084293 A1 | 4/2011 | Mueller-Mach et al. | |
| 2012/0194066 A1 | 8/2012 | Nakamura et al. | |
| 2013/0280520 A1 | 10/2013 | Pan et al. | |
| 2013/0293093 A1 * | 11/2013 | Nonogaki | .............. H05B 33/14 |
| | | | 313/503 |
| 2015/0184070 A1 * | 7/2015 | Kim | ................... C09K 11/7734 |
| | | | 252/301.4 F |
| 2015/0219291 A1 | 8/2015 | Yamaguchi | |
| 2017/0321866 A1 | 11/2017 | Asami et al. | |
| 2018/0275324 A1 | 9/2018 | Fujita et al. | |
| 2019/0031956 A1 | 1/2019 | Inata et al. | |
| 2019/0044037 A1 * | 2/2019 | Fujii | ...................... H01L 33/56 |

FOREIGN PATENT DOCUMENTS

| | | | |
|---|---|---|---|
| JP | 2009-096653 A | | 5/2009 |
| JP | 2010514189 A | | 4/2010 |
| JP | 2011513898 A | | 4/2011 |
| JP | 2014-201726 A | | 10/2014 |
| JP | 2014-234487 A | | 12/2014 |
| JP | 2014234487 A | | 12/2014 |
| JP | 2015149394 A | | 8/2015 |
| JP | 2015199640 A | † | 11/2015 |
| JP | 2016119383 A | | 6/2016 |
| JP | 2016-180076 A | | 10/2016 |
| JP | 2016180075 A | † | 10/2016 |
| JP | 2017107071 A | † | 5/2017 |
| JP | 2017107071 A | | 6/2017 |
| JP | 2018021193 A | | 2/2018 |
| JP | 2018-043912 A | | 3/2018 |
| WO | 2016117623 A1 | | 7/2016 |
| WO | 2017170609 A1 | | 10/2017 |
| WO | 2018021418 A1 | | 2/2018 |

OTHER PUBLICATIONS

United States Patent and Trademark Office, Non-Final Office Action, issued to U.S. Appl. No. 16/212,450 dated Oct. 1, 2020, 27 pages.

\* cited by examiner
† cited by third party

METHOD FOR PRODUCING WAVELENGTH CONVERTING MEMBER, AND WAVELENGTH CONVERTING MEMBER

CROSS-REFERENCE TO RELATED PATENT APPLICATION

This application claims priority to Japanese Patent Application No. 2017-226616, filed on Nov. 27, 2017, Japanese Patent Application No. 2018-020159, filed on Feb. 7, 2018, and Japanese Patent Application No. 2018-218630, filed on Nov. 21, 2018 the entire disclosures of which are hereby incorporated by references in their entirety.

BACKGROUND

Technical Field

The present invention relates to a method for producing a wavelength converting member that convers the wavelength of light emitted from a light emitting diode (which may be hereinafter referred to as an "LED") or a laser diode (which may be hereinafter referred to as an "LD"), and a wavelength converting member. In this specification, the "fluorescent material" is used in the same meaning as a "fluorescent phosphor".

Description of Related Art

A light emitting device using a light emitting element, such as an LED or an LD, is a light source having a high conversion efficiency, and is being utilized as a light source that replaces a filament lamp and a fluorescent lamp, owing to the small electric power consumption, the long lifetime, and the capability of size reduction thereof. The light emitting device contains, housed in a package thereof, a light emitting element and a wavelength converting member that absorbs a part of light emitted from the light emitting element and converts to light having a different wavelength. The light emitting device using an LED or an LD is being utilized in a wide variety of fields including a light emitting device for automobile use or indoor illumination use, a backlight source for a liquid crystal display device, a light source device for an illumination or a projector. In particular, a light emitting device that has a combination of a light emitting element emitting blue light and a fluorescent material emitting yellow light, and emits mixed color light thereof has been widely utilized.

The known fluorescent materials used in the light emitting device include inorganic fluorescent materials, such as a rare earth aluminate fluorescent material represented by $(Y, Gd, Tb, Lu)_3(Al, Ga)_5O_{12}:Ce$, a silicate fluorescent material represented by $(Sr, Ca, Ba)_2SiO_4:Eu$, and a Ca-α-SiAlON fluorescent material. The fluorescent material is dispersed in a resin, and the resin containing the fluorescent material is cured inside the package, so as to constitute the wavelength converting member. As the wavelength converting member, for example, Japanese Unexamined Patent Publication No. 2014-234487 discloses a wavelength converting member formed of a sintered body obtained by mixing glass powder and inorganic fluorescent material powder, and melting and solidifying the glass powder.

However, the wavelength converting member obtained by curing a resin containing a fluorescent material has a possibility of reduction in illuminance caused by deterioration of the resin. The wavelength converting member disclosed in Japanese Unexamined Patent Publication No. 2014-234487 may inhibit emission of the inorganic fluorescent material in some cases due to the glass component incorporated into the inorganic fluorescent material in the formation of the sintered body. Furthermore, due to the relatively low softening point of glass, there is a possibility that the sintered body obtained by melting and solidifying glass powder having been mixed with inorganic fluorescent material powder cannot withstand a high temperature on irradiation with light from a high-power LED or LD.

Consequently, an object of the present disclosure is to provide a method for producing a wavelength converting member that emits light having a desired emission peak wavelength under irradiation of excitation light, and a wavelength converting member.

SUMMARY

The present disclosure includes the following embodiments.

A first embodiment of the present disclosure is a method for producing a wavelength converting member, comprising: providing a green body prepared by a process comprising molding a mixed powder comprising a Ca-α-SiAlON fluorescent material and alumina particles; and primarily sintering the green body at a temperature in a range of 1,000° C. or more and 1,600° C. or less, so as to obtain a first sintered body.

A second embodiment of the present disclosure is a wavelength converting member containing a Ca-α-SiAlON fluorescent material and alumina.

According to the present invention, a method for producing a wavelength converting member that emits light having a desired emission peak wavelength, and such a wavelength converting member can be provided.

DETAILED DESCRIPTION

Figure 1:
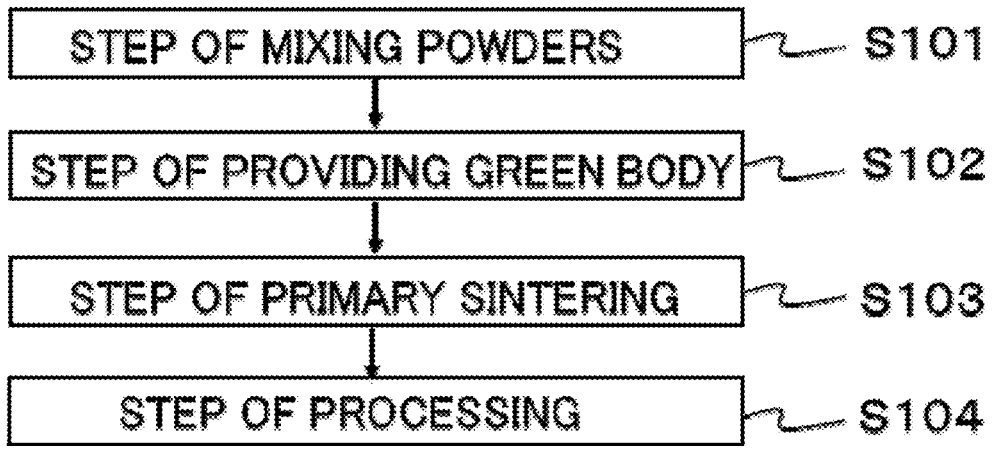
FIG. 1 is a flow chart showing the process sequence of a method for producing a wavelength converting member according to an embodiment of the present disclosure.

The method for producing a wavelength converting member and the wavelength converting member according to the present invention will be described with reference to embodiments below. The embodiments shown below are examples for substantiating the technological concept of the present invention, and the present invention is not limited to the methods for producing a wavelength converting member and the wavelength converting members described below. The relationships between the color names and the chromaticity coordinates, the relationships between the wavelength ranges of light and the color names of monochromatic light are in accordance with JIS Z8110.

Method For Producing Wavelength Converting Member

A method for producing a wavelength converting member according to a first embodiment of the present disclosure comprises: providing a green body prepared by a process comprising molding a mixed powder comprising a Ca-α-SiAlON fluorescent material and depending on necessity an yttrium-aluminum-garnet fluorescent material, and alumina particles; and primarily sintering the green body at a temperature in a range of 1,000° C. or more and 1,600° C. or less, so as to obtain a first sintered body.

The first sintered body containing a Ca-α-SiAlON fluorescent material and alumina obtained by the production method according to the first embodiment of the present disclosure can be used as a wavelength converting member that emits light having a desired emission peak wavelength under irradiation of excitation light. A wavelength converting member formed of the first sintered body is formed of ceramics containing a Ca-α-SiAlON fluorescent material and alumina, and therefore has high thermal conductivity and high heat resistance suppressing deterioration thereof.

According to the production method of the first embodiment of the present disclosure, the Ca-α-SiAlON fluorescent material can be sintered with alumina which is an oxide without decomposition of a part of the crystal structure thereof while retaining the crystal structure of the Ca-α-SiAlON fluorescent material, and thereby the wavelength converting member formed of the sintered body containing the Ca-α-SiAlON fluorescent material can be obtained that emits light having a desired emission peak wavelength under irradiation of excitation light.

A sintered body obtained by melting and solidifying glass powder having been mixed with inorganic fluorescent material powder may cause a problem in emission of the fluorescent material due to the glass component incorporated into the inorganic fluorescent material in the formation of the sintered body. It has been estimated that on sintering an oxynitride fluorescent material, such as a Ca-α-SiAlON fluorescent material, and particles of alumina, which is one of the same oxides as contained in the glass component, nitrogen contained in the composition of the oxynitride fluorescent material easily reacts with oxygen contained in the oxide. Thus, it is presumed that the reaction between the oxynitride and the oxide is accelerated to decompose a part of the crystal structure of the oxynitride fluorescent material. As a result, it is presumed that a sintered body containing a fluorescent material capable of emitting to a practical extent cannot be obtained. However, according to the experiments performed by the present inventors, it has been found that a sintered body obtained by sintering a Ca-α-SiAlON fluorescent material and alumina particles can actually emit light. It is estimated that this is because of the following mechanism. Specifically, alumina is hard to suffer compositional change due to heat, as compared, for example, to the other metal oxides than alumina contained in the glass component, and oxygen released from the composition of alumina is hard to react with the Ca-α-SiAlON fluorescent material. Accordingly, even when a sintered body is formed with alumina particles, alumina is hard to affect adversely the emission of the Ca-α-SiAlON fluorescent material.

In the method for producing a wavelength converting member of the first embodiment of the present disclosure, the mixed powder containing a Ca-α-SiAlON fluorescent material and alumina particles preferably further contains an yttrium-aluminum-garnet fluorescent material (which may be hereinafter referred to as a "YAG fluorescent material"). In the case where the mixed powder contains a Ca-α-SiAlON fluorescent material and alumina particles, and further contains a YAG fluorescent material, the green body obtained by molding the mixed powder is preferably primarily sintered at a temperature in a range of 1,000° C. or more and 1,500° C. or less, so as to obtain a first sintered body. In the wavelength converting member obtained by the production method of the first embodiment of the present disclosure, the Ca-α-SiAlON fluorescent material and the YAG fluorescent material are sintered with alumina, which is an oxide, to form the first sintered body without decomposition of a part of the crystal structure of the Ca-α-SiAlON fluorescent material and the crystal structure of the YAG fluorescent material while retaining the crystal structures of both of them. In the production method of the first embodiment of the present disclosure, the Ca-α-SiAlON fluorescent material and the YAG fluorescent material can be contained in one sintered body while retaining the crystal structures of the Ca-α-SiAlON fluorescent material and the YAG fluorescent material, and thereby a wavelength converting member that emits in a desired color tone can be provided by controlling the amounts of the Ca-α-SiAlON fluorescent material and the YAG fluorescent material contained in one sintered body, without the use of a fluorescent material having been changed in composition for providing a desired color tone. The wavelength converting member formed of the first sintered body is formed of ceramics containing a Ca-α-SiAlON fluorescent material, a YAG fluorescent material, and alumina, and therefore has high thermal conductivity and high heat resistance suppressing deterioration thereof.

Ca-α-SiAlON Fluorescent Material

The Ca-α-SiAlON fluorescent material used is preferably a Ca-α-SiAlON fluorescent material having a composition shown by the following formula (I):

$$Ca_v(Si,Al)_{12}(O,N)_{16}:Eu \qquad (I)$$

wherein in the formula (I), v satisfies $0<v\leq 2$.

In the compositional formula in the description herein, plural elements delimited with commas (,) mean that at least one kind of the plural elements is contained in the composition. The plural elements delimited with commas (,) in the compositional formula mean that the composition contains at least one kind of the plural elements delimited with commas, and may contain a combination of two or more kinds of the plural elements.

The Ca-α-SiAlON fluorescent material used is more preferably a Ca-α-SiAlON fluorescent material having a composition shown by the following formula (II):

$$M_kSi_{12-(m+n)}Al_{m+n}O_nN_{16-n}:Eu \qquad (II)$$

wherein in the formula, M is at least one element selected form the group consisting of Li, Mg, Ca, Sr, Y and lanthanoid elements excluding La and Ce, k, m and n satisfy satisfies $0<k\leq 2.0$, $2.0\leq m\leq 6.0$, $0\leq n\leq 1.0$.

In the production method of the first embodiment of the present invention, the Ca-α-SiAlON fluorescent material is used as a raw material of the first sintered body. The Ca-α-SiAlON fluorescent material as a raw material is preferably in the form of powder. The Ca-α-SiAlON fluorescent material preferably has an average particle diameter in a range of 2 μm or more and 30 μm or less, more preferably in a range of 3 μm or more and 25 μm or less, further preferably in a range of 4 μm or more and 20 μm or less, and still further preferably in a range of 5 μm or more and 15 μm or less. When the average particle diameter of the Ca-α-SiAlON fluorescent material is 2 μm or more, the Ca-α-SiAlON fluorescent material can be dispersed substantially uniformly in the mixed powder, and the Ca-α-SiAlON fluorescent material can be dispersed substantially uniformly in the green body. When the average particle diameter of the Ca-α-SiAlON fluorescent material is 30 μm or less, the voids in the wavelength converting member can be reduced to increase the light conversion efficiency. In the description herein, the average particle diameter of the Ca-α-SiAlON fluorescent material means the particle diameter where the volume cumulative frequency reaches 50% from the small diameter side (i.e., the median diameter) in the volume-based particle size distribution by the laser diffractive scattering particle size distribution measuring method. For the laser diffractive scattering particle size distribution measuring method, the measurement may be performed, for example, by using a laser diffractive scattering particle size distribution measuring instrument (Mastersizer 3000, produced by Malvern Panalytical, Ltd.).

The content of the Ca-α-SiAlON fluorescent material in terms of mass proportion during preparation with respect to 100% by mass of the mixed powder constituting the green body is preferably in a range of 0.1% by mass or more and 40% by mass or less, more preferably in a range of 0.5% by mass or more and 38% by mass or less, further preferably in a range of 0.8% by mass or more and 35% by mass or less, and still further preferably in a range of 1% by mass or more and 30% by mass or less. When the content of the Ca-α-SiAlON fluorescent material with respect to 100% by mass of the mixed powder constituting the green body is in a range of 0.1% by mass or more and 40% by mass or less, a wavelength converting member having a high light conversion efficiency can be obtained. When the content of the Ca-α-SiAlON fluorescent material in the mixed powder constituting the green body is less than 0.1% by mass, a wavelength converting member having a desired conversion efficiency may not be obtained. When the content of the Ca-α-SiAlON fluorescent material in the mixed powder constituting the green body exceeds 40% by mass, the content of the alumina particles becomes relatively small, and the density of the resulting wavelength converting member may become small to lower the mechanical strength thereof in some cases. Furthermore, when the content of the Ca-α-SiAlON fluorescent material exceeds 40% by mass, the thickness of the wavelength converting member may be necessarily made thin for providing, for example, a desired color tone and a desired conversion efficiency, due to the too large content of the Ca-α-SiAlON fluorescent material in the volume of the wavelength converting member, thereby failing to provide a desired strength as the wavelength converting member, which may make the handling thereof difficult in some cases.

YAG Fluorescent Material

The YAG fluorescent material used may be a rare earth aluminate fluorescent material represented by (Y, Gd, Tb, Lu)$_3$Al$_5$O$_{12}$:Ce.

The YAG fluorescent material used is preferably a rare earth aluminate fluorescent material having a composition represented by the following formula (III):

$$(Y_{1-a-b}Gd_aCe_b)_3Al_5O_{12} \tag{III}$$

wherein in the formula (III), a and b satisfy 0≤a≤0.500 and 0≤b≤0.030.

In the production method of the first embodiment of the present disclosure, the YAG fluorescent material is used as a raw material of the first sintered body. The YAG fluorescent material as a raw material is preferably in the form of powder. The YAG fluorescent material preferably has an average particle diameter in a range of 1 μm or more and 50 μm or less, more preferably in a range of 1 μm or more and 40 μm or less, further preferably in a range of 2 μm or more and 30 μm or less, still further preferably in a range of 2 μm or more and 20 μm or less, and particularly preferably in a range of 2 μm or more and 15 μm or less. When the average particle diameter of the YAG fluorescent material is 1 μm or more, the YAG fluorescent material can be dispersed substantially uniformly in the mixed powder, and the YAG fluorescent material can be dispersed substantially uniformly in the green body. When the average particle diameter of the YAG fluorescent material is 50 μm or less, the voids in the wavelength converting member can be reduced to increase the light conversion efficiency. In the description herein, the average particle diameter of the YAG fluorescent material means the average particle diameter measured by the fisher sub-sieve sizer method (which may be hereinafter referred to as the "FSSS method") (i.e., the fisher sub-sieve sizer's number). The FSSS method is a type of an air permeability method for measuring a specific surface area by utilizing the flow resistance of air to determine a particle size.

The total content of the Ca-α-SiAlON fluorescent material and the YAG fluorescent material in terms of mass proportion during preparation with respect to 100% by mass of the mixed powder constituting the green body is preferably in a range of 0.1% by mass or more and 70% by mass or less, more preferably in a range of 0.5% by mass or more and 65% by mass or less, further preferably in a range of 0.8% by mass or more and 60% by mass or less, still further preferably in a range of 1% by mass or more and 55% by mass or less, and particularly preferably in a range of 2% by mass or more and 50% by mass or less. When the total content of the Ca-α-SiAlON fluorescent material and the YAG fluorescent material with respect to 100% by mass of the mixed powder constituting the green body is in a range of 0.1% by mass or more and 70% by mass or less, a wavelength converting member having a high light conversion efficiency can be obtained. When the total content of the Ca-α-SiAlON fluorescent material and the YAG fluorescent material with respect to 100% by mass of the mixed powder constituting the green body is less than 0.1% by mass, a wavelength converting member having a desired conversion efficiency may not be obtained. When the total content of the Ca-α-SiAlON fluorescent material and the YAG fluorescent material with respect to 100% by mass of the mixed powder constituting the green body exceeds 70% by mass, the content of the fluorescent materials becomes relatively large, and therefore the first sintered body is necessarily thin in use for providing a desired wavelength conversion efficiency or providing a desired color tone. The first sintered body that is made thin for providing a desired color tone may fail to provide a desired strength as the wavelength converting member, which may make the handling thereof difficult in some cases. When the total content of the Ca-α-SiAlON fluorescent material and the YAG fluorescent material with respect to 100% by mass of the mixed powder constituting the green body exceeds 70% by mass, furthermore, the amount of the fluorescent material particles contained in the green body becomes large, and the amount of the alumina becomes relatively small, resulting in difficulty in increasing the density of the relative density of the resulting wavelength converting member in some cases.

The mixing ratio of the Ca-α-SiAlON fluorescent material and the YAG fluorescent material in the mixed powder constituting the green body may be a content of the Ca-α-SiAlON fluorescent material in a range of 0.1% by mass or more and 40% by mass or less and a total content of the Ca-α-SiAlON fluorescent material and the YAG fluorescent material in a range of 0.1% by mass or more and 70% by mass or less, with respect to 100% by mass of the mixed powder constituting the green body, and it suffices that a desired wavelength conversion efficiency can be obtained, and a desired color tone can be obtained. When the total content of the Ca-α-SiAlON fluorescent material and the YAG fluorescent material is in a range of 0.1% by mass or more and 70% by mass or less, and the content of the Ca-α-SiAlON fluorescent material is in a range of 0.1% by mass or more and 40% by mass or less, with respect to 100% by mass of the mixed powder constituting the green body, for example, the mass ratio of the Ca-α-SiAlON fluorescent material particles and the YAG fluorescent material particles (Ca-α-SiAlON fluorescent material particles:YAG fluorescent material particles) in terms of mass ratio during preparation is preferably 1:99 to 99:1, more preferably 2:98 to 98:2, further preferably 3:97 to 95:5, and still further preferably 4:96 to 90:10.

The content of the YAG fluorescent material is such that a total content of the Ca-α-SiAlON fluorescent material and the YAG fluorescent material is in a range of 0.1% by mass or more and 70% by mass or less and a content of the Ca-α-SiAlON fluorescent material is in a range of 0.1% by mass or more and 40% by mass or less, with respect to 100% by mass of the mixed powder constituting the green body. The content of the YAG fluorescent material in terms of mass proportion during preparation with respect to 100% by mass of the mixed powder constituting the green body is preferably in a range of 0.1% by mass or more and 69.9% by mass or less, more preferably in a range of 0.5% by mass or more and 60% by mass or less, further preferably in a range of 0.8% by mass or more and 50% by mass or less, still further preferably in a range of 1% by mass or more and 40% by mass or less, and particularly preferably in a range of 1% by mass or more and 30% by mass or less. When the content of the YAG fluorescent material is in a range of 0.1% by mass or more and 69.9% by mass or less with respect to 100% by mass of the mixed powder constituting the green body, a wavelength converting member that emits in a desired color tone can be provided.

Alumina Particles

In the production method of the first embodiment of the present disclosure, the alumina particles are used as a raw material of the first sintered body. The alumina particles used as a raw material preferably have an alumina purity of 99.0% by mass or more, and more preferably an alumina purity of 99.5% by mass or more. When the powder constituting the green body contains alumina particles having an alumina purity of 99.0% by mass or more, the first sintered body or a second sintered body thus obtained may have a high transparency to provide a high light conversion efficiency, thereby providing a wavelength converting member having a good thermal conductivity. In the case where commercially available alumina particles are used, for the alumina purity thereof, reference may be made to the value of the alumina purity described in the brochure thereof. In the case where the alumina purity is unknown, the alumina purity can be measured by measuring the mass of alumina particles, sintering the alumina particles at 800° C. for 1 hour in the air atmosphere to remove the organic content adhering to the alumina particles and water absorbed by the alumina particles, measuring the mass of the sintered alumina particles, and dividing the mass of the sintered alumina particles by the mass of the unsintered alumina particles. For example, the alumina purity can be calculated using the following equation.

The alumina purity (% by mass)=(the mass of sintered alumina particles÷the mass of unsintered alumina particles)×100

The alumina particles preferably has an average particle diameter in a range of 0.1 μm or more and 1.3 μm or less, more preferably in a range of 0.2 μm or more and 1.0 μm or less, further preferably in a range of 0.3 μm or more and 0.8 μm or less, and still further preferably in a range of 0.3 μm or more and 0.6 μm or less. When the average particle diameter of the alumina particles is in the above ranges, the powder of the Ca-α-SiAlON fluorescent material and the alumina particles can be uniformly mixed, and a wavelength converting member formed of a sintered body having a high density with less voids can be produced. In the description herein, the average particle diameter of the alumina particles means the average particle diameter measured by the FSSS method (i.e., the fisher sub-sieve sizer's number).

With respect to 100% by mass of the mixed powder constituting the green body, the content of the alumina particles may be the balance of the fluorescent materials. In the case where the mixed powder constituting the green contains the Ca-α-SiAlON fluorescent material and the alumina particles, the content of the alumina particles may be the balance of the mixed powder, i.e., the mixed powder excluding the Ca-α-SiAlON fluorescent material, and is preferably in a range of 60% by mass or more and 99.9% by mass or less.

In the case where the mixed powder constituting the green body contains the Ca-α-SiAlON fluorescent material, the YAG fluorescent material, and the alumina particles, the content of the alumina particles may be the balance of the mixed powder, i.e., the mixed powder excluding the total content of the Ca-α-SiAlON fluorescent material and the YAG fluorescent material, and is preferably in a range of 30% by mass or more and 99.9% by mass or less.

The kind of alumina constituting the alumina particles is not particularly limited, and any of γ-alumina, δ-alumina, θ-alumina, and α-alumina may be used. The alumina used is preferably α-alumina since α-alumina is easily available, the powder of the Ca-α-SiAlON fluorescent material and the alumina particles can be easily mixed, and the green body can be easily formed.

The method for producing a wavelength converting member of the first embodiment of the present disclosure preferably further includes secondarily sintering the first sintered body containing the Ca-α-SiAlON fluorescent material and the alumina particles by applying a hot isostatic pressing JIS Z 2500:2000 No. 2112 (which may be hereinafter referred to as a "HIP") treatment at a temperature in a range of 1,000° C. or more and 1,600° C. or less, so as to obtain a second sintered body. The second sintered body obtained by the aforementioned method for producing a wavelength converting member has a further increased density since the first sintered body is secondarily sintered by a HIP treatment at a temperature in a range of 1,000° C. or more and 1,600° C. or less, and thus can be used as a wavelength converting member that emits light having a desired emission peak wavelength with less chromaticity unevenness under irradiation of excitation light.

The method for producing a wavelength converting member of the first embodiment of the present disclosure may further include secondarily sintering the first sintered body containing the Ca-α-SiAlON fluorescent material and depending on necessity the YAG fluorescent material, and the alumina particles by a HIP treatment at a temperature in a range of 1,000° C. or more and 1,500° C. or less, so as to provide a second sintered body. The second sintered body obtained by the aforementioned method for producing a wavelength converting member has a further increased density since the first sintered body is secondarily sintered by a HIP treatment at a temperature in a range of 1,000° C. or more and 1,500° C. or less, and thus can be used as a wavelength converting member that emits light having a desired emission peak wavelength with less chromaticity unevenness under irradiation of excitation light.

FIG. 1 is a flowchart showing an illustrative order of steps in the method for manufacturing a wavelength conversion member according to the first embodiment. Steps in the method for manufacturing a wavelength conversion member will be described referring to FIG. 1. The method for manufacturing a wavelength conversion member includes Step S102 of providing a green body, Step S103 of primary sintering. The method for manufacturing a wavelength conversion member may include Step S101 of mixing powders before Step S102 of providing a green body and may include Step S104 of processing the wavelength conversion member after Step S103 of primary sintering.

Step of Mixing Powders

In the step of mixing powders, powder of the Ca-α-SiAlON fluorescent material and the alumina particles are mixed as the powder constituting the green body. In the step of mixing powders, the Ca-α-SiAlON fluorescent material and depending on necessity the YAG fluorescent material, and the alumina particles are preferably mixed as the powder constituting the green body. The powder may be mixed by using a mortar and a pestle. The powder may also be mixed by using a mixing medium, such as a ball mill. A small amount of a shaping auxiliary, such as water and ethanol, may be used to facilitate mixing of the powders and shaping of the mixed powder. The shaping auxiliary is preferably evaporated easily in the subsequent steps of sintering. In the case where the shaping auxiliary is added, the amount of the shaping auxiliary is preferably 10% by mass or less, more preferably 8% by mass or less, further preferably 5% by mass or less, relative to 100% by mass of the mixed powder.

Step of Providing Green Body

In the step of providing a green body, the mixed powder containing the Ca-α-SiAlON fluorescent material and depending on necessity the YAG fluorescent material, and the alumina particles is molded into a desired shape to provide a green body. The molding method of the mixed powder employed may be a known method, such as a press forming include press molding, and a cold isostatic pressing (which may be hereinafter referred to as a "CIP"). For conditioning the shape of the green body, two molding method may be used in combination, and for example, it is possible that a mold press process is performed, and then a CIP is performed. In the CIP, the green body is pressed preferably with water as a medium.

The pressure in the press molding is preferably 3 MPa to 50 MPa, and more preferably 4 MPa to 20 MPa. If the pressure in the press molding is in the above ranges, the green body can be adjust to a desired shape.

The pressure in the CIP is preferably 50 MPa to 250 MPa, and more preferably 100 MPa to 200 MPa. If the pressure in the CIP treatment is in the above ranges, the density of the green body may be increased, and the green body may have a substantially uniform density all over the green body, thereby increasing the densities of the sintered body obtained in the step of primarily sintering and the step of secondarily sintering described later.

Step of Primarily Sintering

The step of primarily sintering is a step of primarily sintering the green body, which is obtained by molding the mixed powder containing the Ca-α-SiAlON fluorescent material and the alumina particles, at a temperature in a range of 1,000° C. or more and 1,600° C. or less, so as to obtain a first sintered body. In the case where the green body contains the Ca-α-SiAlON fluorescent material, the YAG fluorescent material, and the alumina particles, the step of primarily sintering is a step of primarily sintering the green body at a temperature in a range of 1,000° C. or more and 1,500° C. or less, so as to obtain a first sintered body. In the step of primarily sintering, the sintered densities of the Ca-α-SiAlON fluorescent material and the alumina particles contained in the green body are increased, and the wavelength converting member that emits light having a desired emission peak wavelength under irradiation of excitation light can be obtained.

The green body containing the Ca-α-SiAlON fluorescent material and the alumina particles is primarily sintered at a temperature in a range of 1,000° C. or more and 1,600° C. or less, so as to provide a first sintered body, and thereby in the step of secondarily sintering subsequent to the step of primarily sintering, the density of a second sintered body further obtained therein can be increased. While there are cases where the first sintered body obtained by the step of primarily sintering has a lower density than the second sintered body obtained by the step of secondarily sintering, the first sintered body obtained by the step of primarily sintering can be used as the wavelength converting member that emits light having a desired emission peak wavelength under irradiation of excitation light.

Depending on the temperature and the content of the Ca-α-SiAlON fluorescent material in the first sintered body, there are cases where the first sintered body has a higher density than the second sintered body since the closed pores contained in the first sintered body are collapsed by the secondary sintering by applying a HIP treatment, and simultaneously the Ca-α-SiAlON fluorescent material contained in the first sintered body is partially decomposed and evaporated to form open pores in the second sintered body.

The temperature of the primary sintering is in a range of 1,000° C. or more and 1,600° C. or less. When the temperature of the primary sintering is less than 1,000° C., the relative density cannot be increased. When the temperature of the primary sintering exceeds 1,600° C., the Ca-α-SiAlON fluorescent material and the alumina particles are reacted within the green body to decompose the crystal structure of the Ca-α-SiAlON fluorescent material, and the resulting first sintered body does not emit light even under irradiation of excitation light. The temperature of the primary sintering is preferably in a range of 1,100° C. or more and less than 1,600° C., more preferably in a range of 1,100° C. or more and 1,580° C. or less, more preferably in a range of 1,200° C. or more and 1,570° C. or less, further preferably in a range of 1,300° C. or more and 1,560° C. or less, still further preferably in a range of 1,400° C. or more and 1,550° C. or less, still further preferably in a range of 1,400° C. or more and 1,540° C.° C., still further preferably in a range of 1,450° C. or more and 1,540° C. or less, still further preferably in a range of 1,470° C. or more and 1,540° C. or less. The temperature of the primary sintering may be in a range of 1,400° C. or more and 1,500° C. or less.

In the case where the green body is obtained by molding the mixed powder containing the YAG fluorescent material in addition to the Ca-α-SiAlON fluorescent material and the alumina particles, the temperature of the primary sintering is preferably in a range of 1,000° C. or more and 1,500° C. or less. In the case where the green body is obtained by molding the mixed powder containing the YAG fluorescent material in addition to the Ca-α-SiAlON fluorescent material, when the temperature of the primary sintering is in a range of 1,000° C. or more and 1,500° C. or less, the crystal structure of the Ca-α-SiAlON fluorescent material contained in the green body is not decomposed even with the green body obtained by molding the mixed powder containing the YAG fluorescent material in addition to the Ca-α-SiAlON fluorescent material, and the first sintered body that emits light having a desired emission peak wavelength under irradiation of excitation light can be obtained. The temperature of the primary sintering for the green body obtained by molding the mixed powder containing the Ca-α-SiAlON fluorescent material, the YAG fluorescent material, and the alumina particles is preferably in a range of 1,100° C. or more and 1,500° C. or less, more preferably in a range of 1,100° C. or more and 1,450° C. or less, and further preferably in a range of 1,200° C. or more and 1,450° C. or less.

Examples of the primary sintering include an atmospheric sintering method performing sintering under a non-oxidizing atmosphere without application of pressure and load, an atmospheric pressure sintering method performing sintering under a non-oxidizing atmosphere with application of pressure, a hot-press sintering method, and a spark plasma sintering (SPS) method.

The primary sintering is preferably performed under an atmosphere containing nitrogen gas. The atmosphere containing nitrogen gas may be an atmosphere containing at least 99% by volume of nitrogen gas. The content of nitrogen gas in the atmosphere containing nitrogen gas is preferably 99% by volume or more, and more preferably 99.5% by volume or more. The atmosphere containing nitrogen gas may further contain a slight amount of gas, such as oxygen gas, in addition to nitrogen gas, and the content of oxygen in the atmosphere containing nitrogen gas is preferably 1% by volume or less, more preferably 0.5% by volume or less, further preferably 0.1% by volume or less, still further preferably 0.01% by volume or less, and particularly preferably 0.001% by volume or less. When the atmosphere of the primary sintering is the atmosphere containing nitrogen gas, the deterioration of the crystal structure of the Ca-α-SiAlON fluorescent material in the primary sintering may be suppressed, and the first sintered body containing the Ca-α-SiAlON fluorescent material that retains the crystal structure thereof can be obtained.

The ambient pressure of the primary sintering is preferably in a range of 0.2 MPa or more and 200 MPa or less. The ambient pressure means gauge pressure. The primary sintering is preferably performed under an ambient pressure in a range of 0.2 MPa or more and 200 MPa or less. The higher the temperature is, the easier the decomposition of the Ca-α-SiAlON fluorescent material as an oxynitride becomes, and by performing the primary sintering under a pressurized ambient in a range of 0.2 MPa or more and 200 MPa or less, the decomposition of the Ca-α-SiAlON fluorescent material may be further suppressed to obtain the first sintered body having a high emission intensity. The ambient pressure in terms of gauge pressure is more preferably in a range of 0.2 MPa or more and 1.0 MPa or less, and further preferably in a range of 0.8 MPa or more and 1.0 MPa or less.

The period of time of the primary sintering may be appropriately selected depending on the ambient pressure. The period of time of the primary sintering may be, for example, in a range of 0.5 hour or more and 20 hours or less, and is preferably in a range of 1 hour or more and 10 hours or less.

Figure 2:
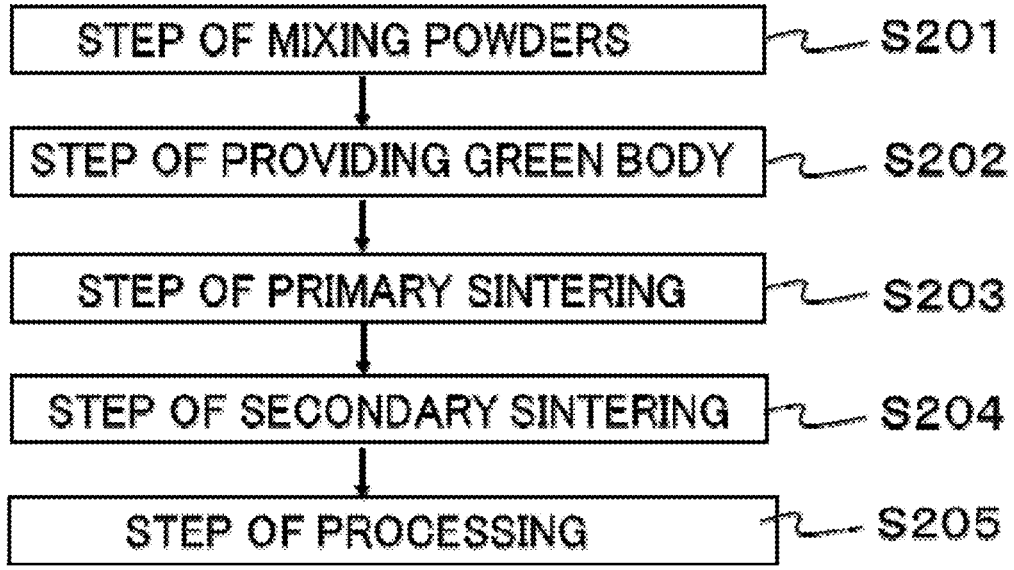
FIG. 2 is a flow chart showing the process sequence of a preferred method for producing a wavelength converting member according to an embodiment of the present disclosure.

FIG. 2 is a flowchart showing an illustrative order of steps in the method for manufacturing a wavelength conversion member according to one of the embodiment. Steps in the method for manufacturing a wavelength conversion member will be described referring to FIG. 2. The method for manufacturing a wavelength conversion member includes Step S202 of providing a green body, Step S203 of primarily sintering, and Step S204 of secondarily sintering. The method for manufacturing a wavelength conversion member may include Step S201 of mixing powders before Step S202 of providing a green body and may include Step S205 of processing the wavelength conversion member after Step S204 of secondarily sintering.

Step of Secondarily Sintering

The step of secondarily sintering is a step of secondarily sintering the first sintered body, which is obtained by primarily sintering the green body obtained by molding the mixed powder containing the Ca-α-SiAlON fluorescent material and the alumina particles, by applying a HIP treatment at a temperature in a range of 1,000° C. or more and 1,600° C. or less, so as to provide a second sintered body. In the step of secondarily sintering, the voids contained in the first sintered body can be further reduced by applying the HIP treatment, so as to increase the density of the second sintered body. The second sintered body having a higher density obtained by applying the HIP treatment may have higher transparency. The second sintered body obtained by the step of secondarily sintering may have a further increased density of the sintered body, may emit light having a desired emission peak wavelength under irradiation of excitation light, and can be used as a wavelength converting member.

The temperature of the secondary sintering is in a range of 1,000° C. or more and 1,600° C. or less. When the temperature of the secondary sintering is less than 1,000° C., the second sintered body having a higher relative density than the first sintered body may not be obtained even by performing the secondary sintering. When the temperature of the secondary sintering exceeds 1,600° C., the Ca-α-SiAlON fluorescent material and the alumina particles are reacted within the first sintered body to decompose a part of the crystal structure of the Ca-α-SiAlON fluorescent material, and the resulting second sintered body may have a lowered emission intensity. The temperature of the secondary sintering is preferably in a range of 1,100° C. or more and 1,580° C. or less, more preferably in a range of 1,200° C. or more and 1,570° C. or less, further preferably in a range of 1,300° C. or more and 1,560° C. or less, and still further preferably in a range of 1,400° C. or more and 1,550° C. or less.

In the case where the first sintered body is formed from the green body obtained by molding the mixed powder containing the YAG fluorescent material in addition to the Ca-α-SiAlON fluorescent material and the alumina particles, the temperature of the secondary sintering is preferably in a range of 1,000° C. or more and 1,500° C. or less. In the case where the first sintered body contains the YAG fluorescent material in addition to the Ca-α-SiAlON fluorescent material, when the temperature of the secondary sintering is in a range of 1,000° C. or more and 1,500° C. or less, even in the case where the green body contains the YAG fluorescent material in addition to the Ca-α-SiAlON fluorescent material, and a fluorine-containing compound contained in minute amounts in the YAG fluorescent material having functioned, for example as a flux in the production process thereof remains, the crystal structure of the Ca-α-SiAlON fluorescent material may not be decomposed with the fluorine-containing compound remained in minute amounts, and the density of the sintered body can be increased. The temperature of the secondary sintering for the first sintered body containing the Ca-α-SiAlON fluorescent material, the YAG fluorescent material, and the alumina powder is preferably in a range of 1,100° C. or more and 1,500° C. or less, more preferably in a range of 1,100° C. or more and 1,450° C. or less, and further preferably in a range of 1,200° C. or more and 1,450° C. or less.

The secondary sintering is preferably performed under an inert gas atmosphere. The inert gas atmosphere means an atmosphere that contains argon, helium, nitrogen as a major component in the atmosphere. The atmosphere that contains argon, helium, nitrogen as a major component in the atmosphere means an atmosphere that contains at least one kind of gas selected from the group consisting of argon, helium, and nitrogen in an amount of 50% by volume or more in the atmosphere. The content of oxygen in the inert gas atmosphere is preferably 1% by volume or less, more preferably 0.5% by volume or less, further preferably 0.1% by volume or less, still further preferably 0.01% by volume or less, and particularly preferably 0.001% by volume or less. The inert gas atmosphere may be the same atmosphere as the atmosphere containing nitrogen gas in the primary sintering, and the content of nitrogen gas in the atmosphere containing nitrogen gas is preferably 99% by volume or more, and more preferably 99.5% by volume or more. When the atmosphere of the secondary sintering is the inert gas atmosphere, the deterioration of the crystal structure of the Ca-α-SiAlON fluorescent material in the secondary sintering may be suppressed, and the second sintered body containing the Ca-α-SiAlON fluorescent material that retains the crystal structure thereof can be obtained.

The pressure in the HIP treatment for applying the secondary sintering is preferably in a range of 50 MPa or more and 300 MPa or less, and more preferably in a range of 80 MPa or more and 200 MPa or less. When the pressure in the HIP treatment is in the range, the sintered body may have a high uniform density all over the sintered body without deterioration of the crystal structure of the Ca-α-SiAlON fluorescent material.

The period of time of the HIP treatment for the secondary sintering may be, for example, in a range of 0.5 hour or more and 20 hours or less, and is preferably in a range of 1 hour or more and 10 hours or less.

Step of Processing

The method for producing a wavelength converting member may further include a step of processing the wavelength converting member formed of the first sintered body or the second sintered body. Examples of the step of processing include a step of cutting the resulting wavelength converting member into a desired size. The cutting method used for the wavelength converting member may be a known method, and examples thereof include a blade dicing saw, a laser dicing saw, and a wire saw. Among these, a wire saw is preferred since the cut surface becomes flat with a high accuracy. By the working step, a wavelength converting member having a desired thickness and a desired size can be obtained. The thickness of the wavelength converting member is not particularly limited, and is preferably in a range of 1 μm or more and 1 mm or less, more preferably in a range of 10 μm or more and 800 μm or less, further preferably in a range of 50 μm or more and 500 μm or less, and still further preferably in a range of 100 μm or more and 400 μm or less considering the mechanical strength and the wavelength conversion efficiency.

Relative Density of First Sintered Body

In the method for producing a wavelength converting member of the first embodiment, the first sintered body obtained in the step of primarily sintering preferably has a relative density of 80% or more, more preferably 85% or more, further preferably 90% or more, and still further preferably 91% or more, and particularly preferably 92% or more. The relative density of the first sintered body may be 100%, and the relative density of the first sintered body may be 99% or less, or may be 98% or less. When the relative density of the first sintered body is 80% or more, the first sintered body can be used as the wavelength converting member that emits light having a desired emission peak wavelength under irradiation of excitation light. In the case where secondary sintering is performed after the primary sintering, when the relative density of the first sintered body is 80% or more, the density of the second sintered body can be further increased by the secondary sintering performed after the primary sintering, and the voids in the wavelength converting member can be reduced to suppress the light scattering in the voids, thereby producing the wavelength converting member having a high light conversion efficiency. In the case where the wavelength converting member is formed of the first sintered body, the relative density of the wavelength converting member is the same as the relative density of the first sintered body.

In the description herein, the relative density of the first sintered body means a value calculated by the apparent density of the first sintered body with respect to the true density of the first sintered body. The relative density is calculated using Equation (1) below.

$$\text{The relative density (\%)} = (\text{the apparent density of the first sintered body} \div \text{the true density of the first sintered body}) \times 100 \quad (1)$$

In the case where the first sintered body is formed of the Ca-α-SiAlON fluorescent material and the alumina particles, the true density of the first sintered body is the sum of a value obtained by multiplying the true density of the Ca-α-SiAlON fluorescent material by the mass ratio of the Ca-α-SiAlON fluorescent material to 100% by mass of the mixed powder for forming the green body constituting the first sintered body, and a value obtained by multiplying the true density of the alumina particles by the mass ratio of the alumina particles to 100% by mass of the mixed powder for forming the green body. For example, the true density of the first sintered body is calculated using Equation (2-1) below.

$$\text{The true density of the first sintered body} = ((\text{the mass ratio of the Ca-α-SiAlON fluorescent material to 100\% by mass of the mixed powder for the green body}) \times (\text{the true density of the Ca-α-SiAlON fluorescent material})) + ((\text{the mass ratio of the alumina particles to 100\% by mass of the mixed powder for the green body}) \times (\text{the true density of alumina particles})) \quad (2\text{-}1)$$

In the case where the first sintered body is formed of the Ca-α-SiAlON fluorescent material, the YAG fluorescent material, and the alumina particles, the true density of the first sintered body is the sum of a value obtained by multiplying the mass ratio of the Ca-α-SiAlON fluorescent material to 100% by mass of the mixed powder for forming the green body constituting the first sintered body by the true density of the Ca-α-SiAlON fluorescent material, a value obtained by multiplying the mass ratio of the YAG fluorescent material to 100% by mass of the mixed powder for forming the green body by the true density of the YAG fluorescent material, and a value obtained by multiplying the mass ratio of the alumina particles to 100% by mass of the mixed powder for forming the green body by the true density of the alumina particles. For example, the true density of the first sintered body is calculated using Equation (2-2) below.

$$\text{The true density of first sintered body} = ((\text{the mass ratio of Ca-α-SiAlON fluorescent material to 100\% by mass of the mixed powder for the green body}) \times (\text{the true density of Ca-α-SiAlON fluorescent material}) + ((\text{the mass ratio of YAG fluorescent material to 100\% by mass of the mixed powder for the green body}) \times (\text{the true density of YAG fluorescent material})) + ((\text{the mass ratio of alumina particles to 100\% by mass of the mixed powder for the green body}) \times (\text{the true density of alumina particles})) \quad (2\text{-}2)$$

The apparent density of the first sintered body is a value obtained by dividing the mass of the first sintered body by the volume of the first sintered body obtained by the Archimedes' method. The apparent density of the first sintered body is calculated using Equation (3) below.

$$\text{The apparent density of the first sintered body} = (\text{the mass of first sintered body})/(\text{the volume of first sintered body obtained by Archimedes' method}) \quad (3)$$

Relative Density of Second Sintered Body

The second sintered body obtained after the secondary sintering preferably has a relative density of 90% or more, more preferably 91% or more, further preferably 92% or more, still further preferably 93% or more, and particularly preferably 95% or more. When the relative density of the wavelength converting member formed of the second sintered body is 90% or more, the voids in the wavelength converting member can be reduced to increase the light conversion efficiency. When the relative density of the second sintered body is 90% or more, furthermore, a worked wavelength converting member formed of the second sintered body can be obtained, for example, without cracking in working in the working step. The relative density of the second sintered body may be 100%, and the relative density of the second sintered body may be 99.9% or less, or may be 99.8% or less.

In the description herein, the relative density of the second sintered body means a value calculated by the apparent density of the second sintered body to the true density of the second sintered body. In the case where the wavelength converting member is formed of the second sintered body, the relative density of the wavelength converting member is the same as the relative density of the second sintered body. For example, the relative density of the second sintered can be calculated using Equation (4) below.

$$\text{The relative density (\%)} = ((\text{the apparent density of the second sintered body})/(\text{the true density of second sintered body})) \times 100 \quad (4)$$

The true density of the second sintered body can be calculated in the same manner as the true density of the first sintered body. The true density of the second sintered body is the same as the true density of the first sintered body.

The apparent density of the second sintered body is a value obtained by dividing the mass of the second sintered body by the volume of the second sintered body obtained by the Archimedes' method. The apparent density of the second sintered body can be calculated using Equation (5) below.

$$\text{The apparent density of second sintered body} = (\text{the mass of second sintered body})/(\text{the volume of second sintered body obtained by Archimedes' method}) \quad (5)$$

The first sintered body or the second sintered body thus obtained can emit light having a desired emission peak wavelength under irradiation of excitation light, and can be used as a wavelength converting member. The first sintered body or the second sintered body that has a relative density of 90% or more can have a high relative emission intensity and a high light conversion efficiency.

Wavelength Converting Member

The wavelength converting member contains a Ca-α-SiAlON fluorescent material and alumina, and may have a content of the Ca-α-SiAlON fluorescent material preferably in a range of 0.1% by mass or more and 40% by mass or less. When the content of the Ca-α-SiAlON fluorescent material in the wavelength converting member is 0.1% by mass or more, a desired conversion efficiency may be obtained. When the content of the Ca-α-SiAlON fluorescent material in the wavelength converting member is too large content, the volume of the wavelength converting member may be necessarily made thin for providing a desired color tone and a desired conversion efficiency, due to the too large content of the powder of the Ca-α-SiAlON fluorescent material in the volume of the wavelength converting member, and for example, the thickness of the resulting wavelength converting member may be necessarily small for decreasing the volume thereof, which may make the handling thereof difficult. When the content of the Ca-α-SiAlON fluorescent material in the wavelength converting member is too large content, furthermore, the amount of the alumina in the wavelength converting member is relatively decreased, and the adhesiveness between the Ca-α-SiAlON fluorescent material and the alumina in the wavelength converting member may be decreased to form voids, resulting in decrease of the light conversion efficiency in some cases. The content of the Ca-α-SiAlON fluorescent material in the wavelength converting member can be measured in such a manner that the elements constituting the Ca-α-SiAlON fluorescent material are analyzed by elemental analysis using ICP (inductively coupled plasma) atomic emission spectroscopy, and the content of the Ca-α-SiAlON fluorescent material in the wavelength converting member is calculated from the results of the elemental analysis. The Ca-α-SiAlON fluorescent material contained in the wavelength converting member is preferably a Ca-α-SiAlON fluorescent material having a composition shown by the aforementioned formula (I) or (II).

In the case where the wavelength conversion member contains the YAG fluorescent material in addition to the Ca-α-SiAlON fluorescent material and the alumina particles, the total content of the YAG fluorescent material and the Ca-α-SiAlON fluorescent material is preferably in a range of 0.1% by mass or more and 70% by mass or less. In the case where the wavelength conversion member contains the Ca-α-SiAlON fluorescent material and the YAG fluorescent material, when the content of the Ca-α-SiAlON fluorescent material is in a range of 0.1% by mass or more and 40% by mass or less, and the total content of the Ca-α-SiAlON fluorescent material and the YAG fluorescent material satisfies a range of 0.1% by mass or more and 70% by mass or less, emission with a desired color tone can be obtained under irradiation of excitation light. As far as the content of the Ca-α-SiAlON fluorescent material is 0.1% by mass or more and 40% by mass or less, and the total content of the Ca-α-SiAlON fluorescent material and the YAG fluorescent material satisfies a range of 0.1% by mass or more and 70% by mass or less, the content of the YAG fluorescent material in the wavelength converting member may be 69.9% by mass or less and may be 0.1% by mass or more. The YAG fluorescent material contained in the wavelength converting member may be a rare earth aluminate fluorescent material represented by $(Y, Gd, Tb, Lu)_3Al_5O_{12}$:Ce. The YAG fluorescent material contained in the wavelength converting member is preferably a YAG fluorescent material represented by the aforementioned formula (III). The total content of the Ca-α-SiAlON fluorescent material and the YAG fluorescent material in the wavelength converting member can be measured in such a manner that the elements constituting the Ca-α-SiAlON fluorescent material and the YAG fluorescent material are analyzed by elemental analysis using ICP (inductively coupled plasma) atomic emission spectroscopy, and the total content of the Ca-α-SiAlON fluorescent material and the YAG fluorescent material contained in the wavelength converting member is calculated from the results of the elemental analysis.

The Ca-α-SiAlON fluorescent material or the YAG fluorescent material in the wavelength converting member is distinguished from the alumina in the wavelength converting member with the grain boundary of the Ca-α-SiAlON fluorescent material or the YAG fluorescent material. In the wavelength converting member, the Ca-α-SiAlON fluorescent material or the YAG fluorescent material having a crystal structure different from the crystal structure of the alumina is present, and the wavelength converting member is constituted of ceramics formed integrally with the alumina and the Ca-α-SiAlON fluorescent material, and depending on necessity the YAG fluorescent material. The wavelength converting member according to the second embodiment of the present disclosure is preferably a wavelength converting member formed of the first sintered body or a wavelength member formed of the second sintered body obtained by the production method according to the first embodiment of the present disclosure. The wavelength converting member formed of the first sintered body or the wavelength member formed of the second sintered body obtained by the production method according to the first embodiment of the present disclosure preferably has a relative density of 80% or more. When the relative density of the wavelength converting member is 80% or more, the wavelength converting member may have a high emission intensity and a high light conversion efficiency. When the relative density of the wavelength converting member is 80% or more, furthermore, cracking or breakage may not occur in the wavelength converting member formed of the ceramics even when the wavelength converting member is subjected to processing, such as cutting, and occurrence of chromaticity unevenness can be suppressed in the case where the wavelength converting member is applied to a light emitting device. The relative density of the wavelength converting member is more preferably 85% or more, further preferably 90% or more, still further preferably 91% or more, and particularly preferably 92% or more. The relative density of the wavelength converting member may be 100% and may be 99.9% or less, or may be 99.8% or less.

The wavelength converting member obtained by the production method of the first embodiment or the wavelength converting member of the second embodiment may be combined with a light emitting element, such as an LED or an LD, so as to constitute a light emitting device that emits mixed color light in such a mechanism that the excitation light emitted from the light emitting element is converted to emit light having a desired emission peak wavelength, and the light from the light emitting device and the light obtained through wavelength conversion with the wavelength converting member are mixed. The light emitting device used may be, for example, a light emitting device that emits light having a wavelength range of 350 nm or more and 500 nm or less. The light emitting device used may be, for example, a semiconductor light emitting device using a nitride semiconductor $(In_XAl_YGa_{1-X-Y}N$, wherein $0 \le X$, $0 \le Y$, and $X+Y \le 1$). The use of a semiconductor light emitting device as the excitation light source may provide a stable light emitting device that has a high efficiency, a high linearity of the output with respect to the input, and a high strength against a mechanical impact.

EXAMPLES

The present invention will be specifically described below referring to examples. The present invention is not limited to these examples.

In Examples 1 to 22, a wavelength converting member formed of a first sintered body containing a Ca-α-SiAlON fluorescent material and alumina or a wavelength converting member formed of a second sintered body containing a Ca-α-SiAlON fluorescent material and alumina was produced. In Comparative Examples 1 to 5, a first sintered body containing a Ca-α-SiAlON fluorescent material and a metal oxide other than alumina was produced.

Example 1

Step of Mixing Powders 1 part by mass of a Ca-α-SiAlON fluorescent material having an average particle diameter of 13.0 μm measured by the laser diffractive scattering particle size distribution measuring method (product name: Alonbright, type: YL-600, manufactured by Denka Co., Ltd.) (i.e., 1% by mass of the Ca-α-SiAlON fluorescent material to 100% by mass of a mixed powder for forming a green body) and 99 parts by mass of α-alumina particles having an average particle diameter of 0.5 μm measured by the FSSS method (product name: AA03, manufactured by Sumitomo Chemical Co., Ltd., alumina purity: 99.5% by mass) were weighed and mixed by using a mortar and a pestle, so as to prepare the mixed powder for forming a green body. In Tables 1 and 2, the content (% by mass) of the Ca-α-SiAlON fluorescent material shows the mass ratio of the Ca-α-SiAlON fluorescent material during preparation to 100% by mass of the mixed powder for forming a green body. In Tables 1 and 2, the content of the alumina particles in Examples shows the balance obtained by subtracting the content (% by mass) of the Ca-α-SiAlON fluorescent material from 100% by mass of the mixed powder for forming a green powder.

Step of Providing Green Body

The mixed powder was charged in a mold, and a green body having a cylinder shape having a diameter of 17.0 mm and a thickness of 10 mm was formed under a pressure of 4.6 MPa (46.9 kgf/cm$^2$). The resulting green body was placed in a packaging container, which was then vacuumed, and the green body was subjected to a cold isostatic pressing (CIP) with a CIP equipment (manufactured by Kobe Steel, Ltd.) with water as a pressure medium at 176 MPa.

Step of Primarily Sintering

The resulting green body was primarily sintered by retaining in a sintering furnace (manufactured by Fujidempa Kogyo Co., Ltd.) in a nitrogen atmosphere (nitrogen: 99% by volume or more) under 0.9 MPa at a temperature of 1,500° C. for 6 hours, so as to obtain a first sintered body. The resulting first sintered body 1 was designated as a wavelength converting member. The content of the Ca-α-SiAlON fluorescent material (% by mass) in the wavelength converting member formed of the first sintered body 1 of Example 1 is substantially the same as the mass ratio during preparation of the Ca-α-SiAlON fluorescent material with respect to 100% by mass of the mixed powder for forming the green body.

Example 2

A first sintered body 2 was obtained in the same manner as in Example 1 except that mixed powder obtained by mixing 3 parts by mass of the Ca-α-SiAlON fluorescent material and 97 parts by mass of the α-alumina particles was prepared, and was designated as a wavelength converting member. In Examples 2 to 22, the content of the Ca-α-SiAlON fluorescent material in the wavelength converting member formed of the first sintered body or the second sintered body is substantially the same as the mass ratio during preparation of the Ca-α-SiAlON fluorescent material to 100% by mass of the mixed powder for forming the green body.

Example 3

A first sintered body 3 was obtained in the same manner as in Example 1 except that mixed powder obtained by mixing 5 parts by mass of the Ca-α-SiAlON fluorescent material and 95 parts by mass of the α-alumina particles was prepared, and was designated as a wavelength converting member.

Example 4

A first sintered body 4 was obtained in the same manner as in Example 1 except that mixed powder obtained by mixing 10 parts by mass of the Ca-α-SiAlON fluorescent material and 90 parts by mass of the α-alumina particles was prepared, and was designated as a wavelength converting member.

Example 5

A first sintered body 5 was obtained in the same manner as in Example 1 except that mixed powder obtained by mixing 20 parts by mass of the Ca-α-SiAlON fluorescent material and 80 parts by mass of the α-alumina particles was prepared, and was designated as a wavelength converting member.

Example 6

A first sintered body 6 was obtained in the same manner as in Example 1 except that mixed powder obtained by mixing 5 parts by mass of the Ca-α-SiAlON fluorescent material and 95 parts by mass of the α-alumina particles was prepared, and the primarily sintering temperature was changed to 1,400° C., and was designated as a wavelength converting member.

Example 7

A first sintered body 7 was obtained in the same manner as in Example 1 except that mixed powder obtained by mixing 5 parts by mass of the Ca-α-SiAlON fluorescent material and 95 parts by mass of the α-alumina particles was prepared, and the primarily sintering temperature was changed to 1,450° C., and was designated as a wavelength converting member.

Example 8

A first sintered body 8 was obtained in the same manner as in Example 1 except that mixed powder obtained by mixing 5 parts by mass of the Ca-α-SiAlON fluorescent material and 95 parts by mass of the α-alumina particles was prepared, and the primarily sintering temperature was changed to 1,550° C., and was designated as a wavelength converting member.

Example 9

A first sintered body 9 was obtained in the same manner as in Example 1 except that mixed powder obtained by mixing 5 parts by mass of the Ca-α-SiAlON fluorescent material and 95 parts by mass of the α-alumina particles was prepared, and the primarily sintering temperature was changed to 1,600° C., and was designated as a wavelength converting member.

Example 10

Step of Secondarily Sintering

The first sintered body 1 obtained in Example 1 was secondarily sintering by applying a hot isostatic pressing (HIP) treatment by using a HIP equipment (manufactured by Kobe Steel, Ltd.) with nitrogen gas as a pressure medium in a nitrogen atmosphere (nitrogen: 99% by volume or more) at 1,500° C. and at 195 MPa for 2 hours, so as to provide a second sintered body 10, and the second sintered body 10 was designated as a wavelength converting member.

Example 11

Step of Secondarily Sintering

A second sintered body 11 was obtained by subjecting the first sintered body 2 obtained in Example 2 to apply the HIP treatment in the same manner as in Example 10, and the second sintered body 11 was designated as a wavelength converting member.

Example 12

Step of Secondarily Sintering

A second sintered body 12 was obtained by subjecting the first sintered body 3 obtained in Example 3 to apply the HIP treatment in the same manner as in Example 10, and the second sintered body 12 was designated as a wavelength converting member.

Example 13

Step of Secondarily Sintering

A second sintered body 13 was obtained by subjecting the first sintered body 4 obtained in Example 4 to apply the HIP treatment in the same manner as in Example 10, and the second sintered body 13 was designated as a wavelength converting member.

Example 14

Step of Secondarily Sintering

A second sintered body 14 was obtained by subjecting the first sintered body 5 obtained in Example 5 to apply the HIP treatment in the same manner as in Example 10, and the second sintered body 14 was designated as a wavelength converting member.

Example 15

Step of Secondarily Sintering

A second sintered body 15 was obtained by subjecting the first sintered body 6 obtained in Example 6 to apply the HIP treatment in the same manner as in Example 10, and the second sintered body 15 was designated as a wavelength converting member.

Example 16

Step of Secondarily Sintering

A second sintered body 16 was obtained by subjecting the first sintered body 7 obtained in Example 7 to apply the HIP treatment in the same manner as in Example 10, and the second sintered body 16 was designated as a wavelength converting member.

Example 17

Step of Secondarily Sintering

A second sintered body 17 was obtained by subjecting the first sintered body 8 obtained in Example 8 to apply the HIP treatment in the same manner as in Example 10, and the second sintered body 17 was designated as a wavelength converting member.

Example 18

Step of Secondarily Sintering

A second sintered body 18 was obtained by subjecting the first sintered body 3 obtained in Example 3 to apply the HIP treatment in the same manner as in Example 10 except that the temperature was changed to 1,400° C., and the second sintered body 18 was designated as a wavelength converting member.

Example 19

Step of Secondarily Sintering

A second sintered body 19 was obtained by subjecting the first sintered body 3 obtained in Example 3 to apply the HIP treatment in the same manner as in Example 10 except that the temperature was changed to 1,450° C., and the second sintered body 19 was designated as a wavelength converting member.

Example 20

Step of the Secondarily Sintering

A second sintered body 20 was obtained by subjecting the first sintered body 3 obtained in Example 3 to apply the HIP treatment in the same manner as in Example 10 except that the temperature was changed to 1,550° C., and the second sintered body 20 was designated as a wavelength converting member.

Example 21

Step of Secondarily Sintering

A second sintered body 21 was obtained by subjecting the first sintered body 9 obtained in Example 9 to apply the HIP treatment in the same manner as in Example 10 except that the temperature was changed to 1,500° C., and the second sintered body 21 was designated as a wavelength converting member.

Example 22

Step of Secondarily Sintering

A second sintered body 22 was obtained by subjecting the first sintered body 3 obtained in Example 3 to apply the HIP treatment in the same manner as in Example 10 except that the temperature was changed to 1,600° C., and the second sintered body 22 was designated as a wavelength converting member.

Comparative Example 1

Step of Mixing Powders 5 parts by mass of the Ca-α-SiAlON fluorescent material and 95 parts by mass of titanium oxide particles (manufacture by Toho Titanium Co., Ltd., titanium oxide purity: 99.5% by mass, average size: 2.10 to 2.55 μm (catalogue value)) were mixed to prepare mixed powder. In Table 3, the content (% by mass) of the Ca-α-SiAlON fluorescent material shows the mass ratio during preparation of the Ca-α-SiAlON fluorescent material to 100% by mass of the mixed powder for forming a green body. In Table 3, the content of the metal oxide particles in Comparative Examples shows the balance obtained by subtracting the content (% by mass) of the Ca-α-SiAlON fluorescent material from 100% by mass of the mixed powder for forming a green body. In Comparative Examples 1 to 5, the metal oxide particles mean metal oxide particles other than α-alumina particles, i.e., titanium oxide particles, tantalum pentoxide particles, yttrium oxide particles, hafnium oxide particles, and zirconium oxide particles.

Step of Providing Green Body

The mixed powder was charged in a mold, and a green body having a cylinder shape having a diameter of 17.0 mm and a thickness of 10 mm was formed under a pressure of 4.6 MPa (46.9 kgf/cm$^2$). The resulting green body was placed in a packaging container, which was then vacuumed, and the green body was subjected to a cold isostatic pressing (CIP) with a CIP equipment (manufactured by Kobe Steel, Ltd.) with water as a pressure medium at 176 MPa.

Step of Primarily Sintering

The resulting green body was primarily sintered by retaining in a sintering furnace (manufactured by Fujidempa Kogyo Co., Ltd.) in a nitrogen atmosphere (nitrogen: 99% by volume or more) at a temperature of 1,500° C. for 6 hours, so as to obtain a first sintered body, but the relative density thereof was 71.0%. No emission was observed from the first sintered body. The first sintered body was not applied to the HIP treatment since no emission was observed, and the relative density was as small as 71.0%. This is because in the case where the relative density of the first sintered body is less than 80%, the relative density of the second sintered body obtained by performing the secondary sintering through the HIP treatment cannot be increased to 90% or more due to the large amount of voids contained in the first sintered body.

Comparative Example 2

A first sintered body was obtained in the same manner as in Comparative Example 1 except that 5 parts by mass of the Ca-α-SiAlON fluorescent material and 95 parts by mass of tantalum pentoxide particles (manufactured by H.C. Starck GmbH, tantalum pentoxide purity: 99.5% by mass, average particle diameter by FSSS method: 0.7 μm) were mixed to prepare mixed powder, but the relative density thereof was 64.3%. No emission was observed from the first sintered body. The first sintered body was not applied to the HIP treatment since no emission was observed, and the relative density was as small as 64.3%.

Comparative Example 3

A first sintered body was obtained in the same manner as in Comparative Example 1 except that 5 parts by mass of the Ca-α-SiAlON fluorescent material and 95 parts by mass of yttrium oxide particles (manufactured by Nippon Yttrium Co., Ltd., yttrium oxide purity: 99.5% by mass, average particle diameter by FSSS method: 1.8 μm) were mixed to prepare mixed powder, but the relative density thereof was 49.6%. No emission was observed from the first sintered body. The first sintered body was not applied to the HIP treatment since no emission was observed, and the relative density was as small as 49.6%.

Comparative Example 4

A first sintered body was obtained in the same manner as in Comparative Example 1 except that 5 parts by mass of the Ca-α-SiAlON fluorescent material and 95 parts by mass of hafnium oxide particles (manufacture by Kojundo Chemical Laboratory Co., Ltd., hafnium oxide purity: 98% by mass, average particle diameter by FSSS method: 2.0 μm) were mixed to prepare mixed powder, but the relative density thereof was 51.2%. No emission was observed from the first sintered body. The first sintered body was not applied to the HIP treatment since no emission was observed, and the relative density was as small as 51.2%.

Comparative Example 5

A first sintered body was obtained in the same manner as in Comparative Example 1 except that 5 parts by mass of the Ca-α-SiAlON fluorescent material and 95 parts by mass of zirconium oxide particles (manufacture by Wako Pure Chemical Industries, Ltd., zirconium oxide purity: 99% by mass, average particle diameter by FSSS method: 2.0 μm) were mixed to prepare mixed powder, but the relative density thereof was 67.0%. No emission was observed from the first sintered body. The first sintered body was not applied to the HIP treatment since no emission was observed, and the relative density was as small as 67.0%.

Measurement of Average Particle Diameter by Laser Diffractive Scattering Particle Size Distribution Measuring Method For the particles of the Ca-α-SiAlON fluorescent material used in Examples and Comparative Examples, the average particle diameter thereof was the particle diameter where the volume cumulative frequency reached 50% from the small diameter side (i.e., the median diameter) in the volume-based particle size distribution by the laser diffractive scattering particle size distribution measuring method, and measured by using a laser diffractive scattering particle size distribution measuring instrument (Mastersizer 3000, manufactured by Malvern Panalytical, Ltd.).

Measurement of Average Particle Diameter by FSSS Method

The α-alumina particles used in Examples, and the tantalum pentoxide particles, the yttrium oxide particles, the hafnium oxide particles, and the zirconium oxide particles used in Comparative Examples were measured for the average particle diameter (i.e., the fisher sub-sieve sizer's number) by the FSSS method.

Measurement of α-Alumina Purity

After measuring the mass of the α-alumina particles used in Examples, the α-alumina particles were sintered at 800° C. in the air atmosphere for 1 hour to remove the organic content adhered to the α-alumina particles and water adsorbed to the α-alumina particles, and dividing the mass of the sintered alumina particles by the mass of the unsintered alumina particles. For example, the alumina purity can be calculated using the following equation.

The alumina purity (% by mass)=(the mass of sintered alumina particles÷the mass of unsintered alumina particles)×100

Measurement of Relative Density of First Sintered Body

In Examples 1 to 9 and Comparative Examples 1 to 5, the first sintered bodies were measured for the relative density. The apparent densities and the relative densities of the first sintered bodies of Examples 1 to 9 are shown in Table 1. For Comparative Examples 1 to 5, the relative density was calculated using Equations below in the same manner as in the first sintered bodies of Examples 1 to 9. The relative densities of the first sintered bodies of Comparative Examples 1 to 5 are shown in Table 3.

The relative density (%)=((the apparent density of the first sintered body)/(the true density of the first sintered body))×100   (1)

The true density of the first sintered bodye was calculated using Equation (2-1-1). The calculation was carried out supposing the true density of the α-alumina particles used in Examples 1 to 9 was 3.98 g/cm$^3$, the true density of the titanium oxide particles used in Comparative Example 1 was 4.26 g/cm$^3$, the true density of the tantalum pentoxide particles used in Comparative Example 2 was 8.7 g/cm$^3$, the true density of the yttrium oxide particles used in Comparative Example 3 was 5.01 g/cm$^3$, the true density of the hafnium oxide particles used in Comparative Example 4 was 9.68 g/cm$^3$, and the true density of the zirconium oxide particles used in Comparative Example 5 was 5.6 g/cm$^3$. The calculation was based on the assumption that the true density of the Ca-α-SiAlON fluorescent material was 3.22 g/cm$^3$. In the Equation (2-1-1), the metal oxide particles mean metal oxide particles of any of α-alumina particles, titanium oxide particles, tantalum pentoxide particles, yttrium oxide particles, hafnium oxide particles, and zirconium oxide particles.

The true density of first sintered body=((the mass ratio of Ca-α-SiAlON fluorescent material to 100% by mass of the mixed powder for the green body)×(the true density of the Ca-α-SiAlON fluorescent material))+((the mass ratio of the metal oxide particles to 100% by mass of the mixed powder for the green body)×(the true density of the metal oxide particles))   (2-1-1)

The apparent densities of the first sintered bodies 1 to 9 of Examples 1 to 9 and the first sintered bodies of Comparative Examples 1 to 5 were calculated using Equation (3). The masses (g) and the volumes (cm$^3$) obtained by the Archimedes' method of the first sintered bodies of Examples 1 to 9 are shown in Table 1.

The apparent density of first sintered body=(the mass of first sintered body)/(the volume of the first sintered body obtained by Archimedes' method)   (3)

Measurement of Relative Density of Second Sintered Body

The relative densities of the second sintered bodies 10 to 22 of Examples 10 to 22 were measured using Equations (4) and (5). The results are shown in Table 1. The relative densities thereof were calculated using Equation (4).

The relative density (%)=((the apparent density of second sintered body)/(the true density of second sintered body))×100     (4)

The calculation method for the true density of the second sintered body was that the true density thereof was the sum of a value obtained by multiplying the true density of the α-alumina particles by the mass ratio of the α-alumina particles (specifically, the α-alumina particles used in the step of mixing powders) to 100% by mass of the mixed powder for forming the green body, and a value obtained by multiplying the true density of the Ca-α-SiAlON fluorescent material by the mass ratio of the Ca-α-SiAlON fluorescent material to 100% by mass of the mixed powder for forming the green body. The true density of the Ca-α-SiAlON fluorescent material and the true density of the α-alumina used were the same values as used in the calculation method for the true density of the first sintered body.

The apparent density of the second sintered body was calculated using Equation (5).

The apparent density of second sintered body=(the mass of second sintered body)/(the volume of second sintered body obtained by Archimedes' method)     (5)

Measurement of Relative Emission Intensity

The wavelength converting members formed of the first sintered bodies of Examples 1 to 9, the wavelength converting members formed of the second sintered bodies of Examples 10 to 22, and the first sintered bodies of Comparative Examples 1 to 5 each were cut to a thickness of 300 μm with a wire saw to prepare specimens. By using an LED chip formed of a nitride semiconductor having an emission peak wavelength of 455 nm as a light source, the specimens of the wavelength converting members each were irradiated with light from the light source, and the emission intensities of the emission peak wavelength within a wavelength range of 430 nm or more and 800 nm or less obtained from each of the specimens of Examples 1 to 9, Examples 10 to 22, and Comparative Examples 1 to 5 were measured with a spectrofluorophotometer. The emission intensity of the emission peak wavelength within a wavelength range of 430 nm or more and 800 nm or less obtained from the specimen of the wavelength converting member of Example 1 is assumed to be 100%, and the emission intensities of the emission peak wavelength within a wavelength range of 430 nm or more and 800 nm or less obtained from the specimens are shown as relative emission intensities (%). The results of the wavelength converting members of Examples 1 to 9 are shown in Table 1. The results of the wavelength converting members of Examples 10 to 22 are shown in Table 2. The specimens formed of the first sintered bodies of Comparative Examples 1 to 5 did not emit light even under irradiation of light from the light source. The results of the first sintered bodies of Comparative Examples 1 to 5 are shown in Table 3.

Photograph of External Appearance

Figure 3:
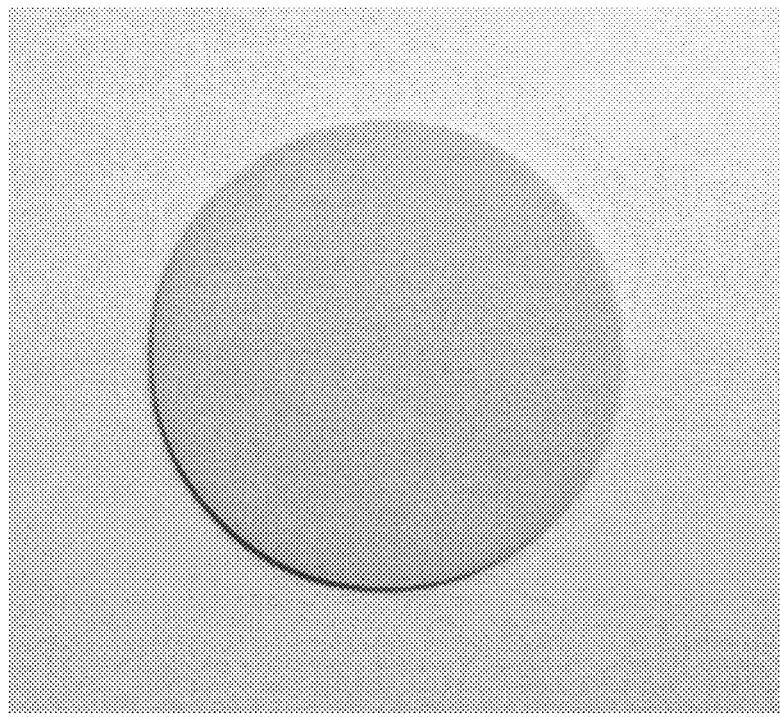
FIG. 3 is the photograph of the external appearance of the wavelength converting member of Example 3.

A photograph of the external appearance of the wavelength converting member of Example 3 was obtained. FIG. 3 is the photograph of the external appearance of the specimen obtained by cutting the wavelength converting member of Example 3 with a wire saw.

Figure 4:
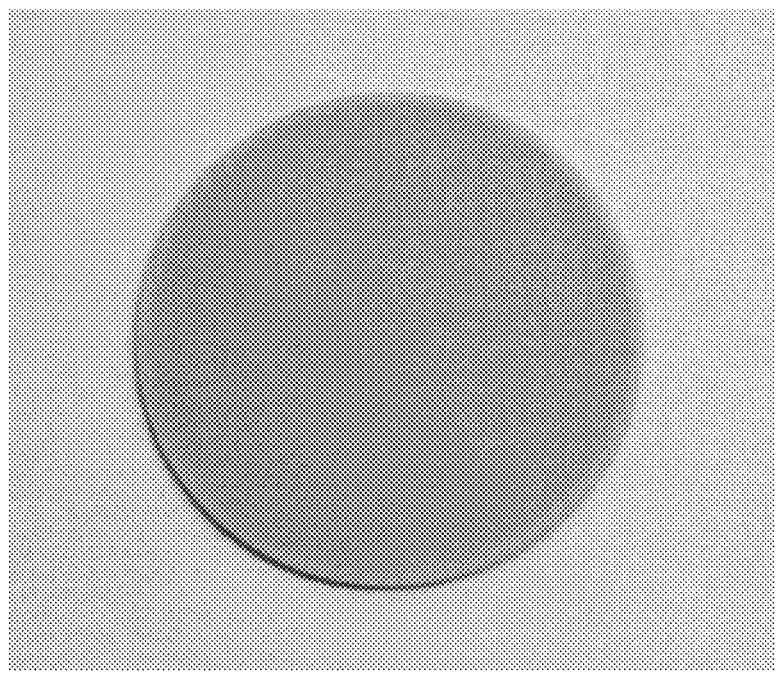
FIG. 4 is the photograph of the external appearance of the wavelength converting member of Example 12.

A photograph of the external appearance of the wavelength converting member of Example 12 was obtained. Example 12 was formed of the second sintered body obtained by secondarily sintering the first sintered body of Example 3. FIG. 4 is the photograph of the external appearance of the specimen obtained by cutting the wavelength converting member of Example 12 with a wire saw.

Figure 5:
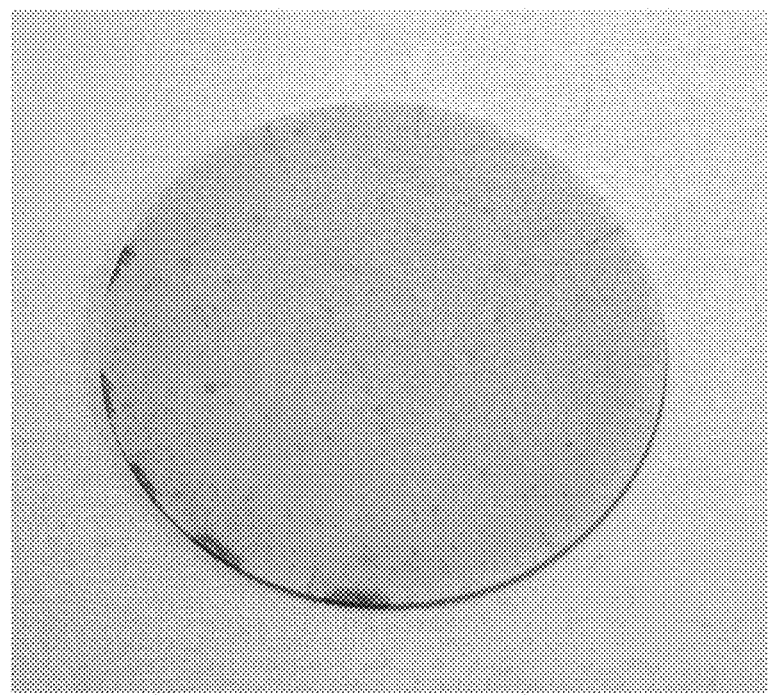
FIG. 5 is the photograph of the external appearance of a first sintered body of Comparative Example 5.

A photograph of the external appearance of the wavelength converting member of Comparative Example 5 was obtained. FIG. 5 is the photograph of the external appearance of the specimen obtained by cutting the first sintered body of Comparative Example 5 with a wire saw.

TABLE 1

| | Content of Ca-α-SiAlON fluorescent material (% by mass) | Primarily sintering temperature (° C.) | First sintered body | | | | | |
|---|---|---|---|---|---|---|---|---|
| | | | No. | Mass (g) | Volume (cm³) | Apparent density (g/cm³) | Relative density (%) | Relative emission intensity (%) |
| Example 1 | 1 | 1500 | 1 | 4.95 | 1.35 | 3.67 | 92.4 | 100.0 |
| Example 2 | 3 | 1500 | 2 | 5.00 | 1.33 | 3.76 | 94.9 | 127.1 |
| Example 3 | 5 | 1500 | 3 | 4.96 | 1.32 | 3.75 | 95.0 | 138.4 |
| Example 4 | 10 | 1500 | 4 | 4.84 | 1.31 | 3.70 | 94.8 | 160.2 |
| Example 5 | 20 | 1500 | 5 | 4.71 | 1.33 | 3.53 | 92.3 | 143.6 |
| Example 6 | 5 | 1400 | 6 | 4.98 | 1.50 | 3.33 | 84.5 | 36.9 |
| Example 7 | 5 | 1450 | 7 | 4.87 | 1.42 | 3.44 | 87.2 | 49.6 |
| Example 8 | 5 | 1550 | 8 | 4.85 | 1.29 | 3.75 | 95.0 | 166.4 |
| Example 9 | 5 | 1600 | 9 | 4.92 | 1.34 | 3.66 | 92.9 | 59.0 |

TABLE 2

| | Content of Ca-α-SiAlON fluorescent material (% by mass) | Primarily sintering temperature (° C.) | First sintered body | | | Second sintered body | | |
|---|---|---|---|---|---|---|---|---|
| | | | No. | Relative density (%) | Relative emission intensity (%) | Secondarily sintering temperature (° C.) | No. | Relative density (%) | Relative emission intensity (%) |
| Example 10 | 1 | 1500 | 1 | 92.4 | 100.0 | 1500 | 10 | 93.5 | 101.0 |
| Example 11 | 3 | 1500 | 2 | 94.9 | 127.1 | 1500 | 11 | 99.3 | 181.8 |
| Example 12 | 5 | 1500 | 3 | 95.0 | 138.4 | 1500 | 12 | 98.1 | 201.0 |
| Example 13 | 10 | 1500 | 4 | 94.8 | 160.2 | 1500 | 13 | 95.2 | 182.5 |
| Example 14 | 20 | 1500 | 5 | 92.3 | 143.6 | 1500 | 14 | 92.0 | 195.0 |
| Example 15 | 5 | 1400 | 6 | 84.5 | 36.9 | 1500 | 15 | 89.0 | 48.9 |
| Example 16 | 5 | 1450 | 7 | 87.2 | 49.6 | 1500 | 16 | 91.7 | 76.7 |
| Example 17 | 5 | 1550 | 8 | 95.0 | 166.4 | 1500 | 17 | 97.9 | 143.4 |
| Example 18 | 5 | 1500 | 3 | 95.0 | 138.4 | 1400 | 18 | 99.1 | 242.9 |
| Example 19 | 5 | 1500 | 3 | 95.0 | 138.4 | 1450 | 19 | 99.1 | 226.4 |
| Example 20 | 5 | 1500 | 3 | 95.0 | 138.4 | 1550 | 20 | 98.5 | 179.9 |
| Example 21 | 5 | 1600 | 9 | 92.9 | 59.0 | 1500 | 21 | 93.7 | 53.7 |
| Example 22 | 5 | 1500 | 3 | 95.0 | 138.4 | 1600 | 22 | 97.5 | 119.4 |

TABLE 3

| | Content of Ca-α-SiAlON fluorescent material (% by mass) | Metal oxide particles | Primaril sintering temperature (° C.) | First sintered body | |
|---|---|---|---|---|---|
| | | | | Relative density (%) | Relative emission intensity (%) |
| Comparative Example 1 | 5 | TiO$_2$ | 1500 | 71.0 | no emission |
| Comparative Example 2 | 5 | Ta$_2$O$_5$ | 1500 | 64.3 | no emission |
| Comparative Example 3 | 5 | Y$_2$O$_3$ | 1500 | 49.6 | no emission |
| Comparative Example 4 | 5 | HfO$_2$ | 1500 | 51.2 | no emission |
| Comparative Example 5 | 5 | ZrO$_2$ | 1500 | 67.0 | no emission |

The first sintered bodies 1 to 9 of Examples 1 to 9 and the second sintered bodies 10 to 22 of Examples 10 to 22 emitted light having an emission peak wavelength within a wavelength range of 430 nm or more and 800 nm or less under irradiation of the excitation light having an emission peak wavelength of 455 nm from the light source, and thus were capable of being used as a wavelength converting member.

As shown in Table 1, in Examples 1 to 5, the first sintered bodies 1 to 5 were obtained in such a manner that the content of the Ca-α-SiAlON fluorescent material was changed in a range of from 1% by mass to 20% by mass, and the temperature of the primary sintering was 1,500° C., and were designated as wavelength converting members. As shown in Table 1, the first sintered bodies 2 to 5 of Examples 2 to 5 each had a high relative density of 92% or more, and had a higher relative emission intensity than the wavelength converting member of Example 1 having a content of the Ca-α-SiAlON fluorescent material of 1% by mass.

As shown in Table 1, for the wavelength converting members of Examples 6 to 9, the first sintered bodies 6 to 9 were obtained in such a manner that the content of the Ca-α-SiAlON fluorescent material was 5% by mass, and the temperature of the primary sintering was changed in a range of from 1,400° C. or more and 1,600° C. or less, so that the wavelength converting members were obtained. As shown in Table 1, for the wavelength converting member of Example 6, it was estimated that voids were present in the first sintered body 6 since the temperature of the primary sintering was 1,400° C., and the relative density of the first sintered body 6 was 84.5%. Due to these reasons, the relative emission intensity of the wavelength converting member of Example 6 was 36.9%. As shown in Table 1, for the wavelength converting member of Example 7, it was estimated that voids were present also in the first sintered body 7 since the temperature of the primary sintering was 1,450° C., and the relative density of the first sintered body 7 was 87.2%. The wavelength converting member of Example 7 had a relative emission intensity of 49.6% since it was estimated from the relative density of 87.2% that voids were present therein. As shown in Table 1, the wavelength converting member of Example 8 had a high relative emission intensity of 166.4% since the temperature of the primary sintering was 1,550° C., and the relative density of the first sintered body 8 was as high as 95.0%, which meant suppression of voids and densification. For the wavelength converting member of Example 9, the first sintered body 9 had a high relative density of 92.9% since the temperature of the primary sintering was as high as 1,600° C. It was estimated that the Ca-α-SiAlON fluorescent material as an oxynitride reacted with the alumina particles as an oxide due to the high temperature of the primary sintering, so as to decompose a part of the crystal structure of the Ca-α-SiAlON fluorescent material.

As shown in Table 2, the wavelength converting members of Examples 10 to 14 were formed of the second sintered bodies 10 to 14 obtained by secondarily sintering the first sintered bodies 1 to 5 at 1,500° C. by applied the HIP treatment, and were densified by the secondary sintering by applying the HIP treatment. In particular the wavelength converting members of Examples 11 to 14 each had a relative emission intensity that was higher than the wavelength converting member of Example 1 by 180% or more.

As shown in Table 2, in Examples 10 to 22 except for Example 14, the second sintered bodies 10 to 13 and 15 to 22 had higher relative densities than the first sintered bodies 1 to 4 and 6 to 9, respectively. It was considered that the slightly smaller relative density of the second sintered body 14 than the first sintered body 5 in Example 14 was caused by such mechanism that since the content of the Ca-α-SiAlON fluorescent material contained in the first sintered body 5 was larger than the other examples, the closed pores contained in the first sintered body 5 were collapsed by applied the HIP treatment as the secondary sintering to cause densification, and a part of the Ca-α-SiAlON fluorescent material was decomposed and evaporated to form open pores in the second sintered body 14. In other words, it was considered that in the second sintered body 14 of Example 14, the amount of the open pores formed by applied the HIP treatment was slightly larger than the amount of the closed pores collapsed by applied the HIP treatment, and thus the relative density of the second sintered body 14 became slightly smaller than the relative density of the first sintered body 5.

As shown in Table 2, for the wavelength converting members of Examples 15 and 16, due to the temperatures of the primary sintering of 1,400° C. and 1,450° C., the relative densities of the resulting first sintered bodies 6 and 7 were 90% or less, and even though the secondary sintering was performed at 1,500° C. by applied the HIP treatment, the relative densities of the resulting second sintered bodies 15 and 16 were 89.0% and 91.7%, respectively. It was estimated from these results that for the wavelength converting members of Examples 15 and 16, many voids were present in the second sintered bodies 15 and 16 obtained by secondarily sintering by applied the HIP treatment since the temperatures for providing the first sintered bodies 6 and 7 were low.

As shown in Table 2, for the wavelength converting member of Example 17, due to the high temperature of the primary sintering of 1,550° C., the second sintered body 17 obtained by secondarily sintering at 1,500° C. by applied the HIP treatment had a higher relative density than the first sintered body 8. It was estimated that in the wavelength converting member, even though the temperature of the secondary sintering was 1,500° C., the Ca-α-SiAlON fluorescent material as an oxynitride easily reacted with the alumina particles as an oxide in the primarily sintering step due to the high temperature of the primary sintering of 1,550° C., and a slight part of the crystal structure of the Ca-α-SiAlON fluorescent material was decomposed by the secondary sintering. It was considered accordingly that in the wavelength converting member, even though the second sintered body had high transparency due to the densification caused by the secondary sintering by applied the HIP treatment, a slight part of the crystal structure of the Ca-α-SiAlON fluorescent material was decomposed by the secondary sintering due to the high temperature of the primary sintering, and thus the emission intensity thereof might be lower than the first sintered body.

As shown in Table 2, for the wavelength converting members of Examples 18 to 20, the temperature of the secondary sintering was changed in a range of 1,400° C. or more and 1,550° C. or less, and even in the case where the temperature of the secondary sintering was 1,400° C. or 1,450° C., which was lower than the temperature of the primary sintering, and in the case where the temperature of the secondary sintering was 1,550° C., which was higher than the temperature of the primary sintering, the second sintered bodies 18 to 20 each having a high relative density of 98.5% or more were obtained. The wavelength converting members formed of the second sintered bodies 18 and 19 each had a high relative emission intensity exceeding 200%.

The wavelength converting member of Example 21 emitted light under irradiation of the excitation light. For the wavelength converting member of Example 21, it was estimated from the temperature of the primary sintering of 1,600° C. and the relative emission intensity of the first sintered body 9 of 59.0%. The Ca-α-SiAlON fluorescent material as an oxynitride reacts with the alumina particles as an oxide when the primary sintering temperature is high and a part of the crystal structure of the Ca-α-SiAlON fluorescent material decomposes in some case. For the wavelength converting member, it was estimated that a part of the crystal structure of the Ca-α-SiAlON fluorescent material was decomposed even though the secondary sintering was performed by applied the HIP treatment after the primary sintering, and therefore the relative emission intensity thereof was low.

The wavelength converting member of Example 22 emitted light under irradiation of the excitation light. For the wavelength converting member of Example 22, it was estimated from the high temperature of the secondary sintering by applied the HIP treatment of 1,600° C. that the Ca-α-SiAlON fluorescent material as an oxynitride reacted with the alumina particles as an oxide, so as to decompose a part of the crystal structure of the Ca-α-SiAlON fluorescent material, and the relative emission intensity thereof was 119.4% even with the relatively high relative density of 97.5%.

As shown in Table 3, the first sintered bodies of Comparative Examples 1 to 5 obtained by primarily sintering the Ca-α-SiAlON fluorescent material with the other oxide than alumina each had a relative density of 71.0% or less and did not emit light even under irradiation of the excitation light.

The appearance of the wavelength converting member of Example 3 had bright orange color all over it, and retained the color inherent to the Ca-α-SiAlON fluorescent material. As shown in FIG. 3, the appearance of the wavelength converting member of Example 3 did not have color unevenness observed but had uniform color all over it, and it was found that the Ca-α-SiAlON fluorescent material contained in the wavelength converting member was not degraded by the primary sintering.

The appearance of the wavelength converting member of Example 12 was bright all over it, which had darker orange color than Example 3, and retained the color inherent to the Ca-α-SiAlON fluorescent material. It was considered that the reason why the appearance of the wavelength converting member of Example 12 was brighter and had darker orange color than that of Example 3 was that the densification of the second sintered body 12 obtained by the secondary sintering by applied the HIP treatment proceeded to increase the transparency thereof. As shown in FIG. 4, the appearance of the wavelength converting member of Example 12 did not have color unevenness observed but had uniform color all over it, and it was found that the Ca-α-SiAlON fluorescent material was not degraded by the secondary sintering by applied the HIP treatment.

The appearance of the first sintered body of Comparative Example 5 was whitish all over it, which had some black discolored portions, and the orange color inherent to the Ca-α-SiAlON fluorescent material was not retained. As shown in FIG. 5, the appearance of the first sintered body of Comparative Example 5 had color unevenness having some black discolored portions, and it was suggested that the Ca-α-SiAlON fluorescent material was degraded by the primary sintering.

In Examples 23 to 41, a wavelength converting member formed of a first sintered body containing a Ca-α-SiAlON fluorescent material, a YAG fluorescent material, and alumina was produced. In Comparative Examples 6 to 9, a first sintered body containing a YAG fluorescent material and alumina but not containing a Ca-α-SiAlON fluorescent material was produced.

Production of YAG Fluorescent Material

Yttrium oxide ($Y_2O_3$), gadolinium oxide ($Gd_2O_3$), cerium oxide ($CeO_2$), and aluminum oxide ($Al_2O_3$) were weighed to make the target composition and mixed to provide a raw material mixture. Barium fluoride ($BaF_2$) as a flux was added to the raw material mixture, and the raw material mixture and the flux were further mixed in a ball mill. The mixture was placed in an alumina crucible and heat-treated under a reducing atmosphere at 1,500° C. for 10 hour to provide a sintered material. The sintered material was dispersed in pure water and passed through a wet sieve by flowing the solvent (pure water) under application of vibration through the sieve. Subsequently, after dehydration and drying, the sintered material was classified by passing through a dry sieve, so as to provide an yttrium-aluminum-garnet fluorescent material (which may be hereinafter referred to as a "YAG fluorescent material"). The average particle diameter of the YAG fluorescent material was measured by the FSSS method in the same manner as in the measurement of the average particle diameter of the α-alumina particles in Example 1 (i.e., the fisher sub-sieve sizer's number). The YAG fluorescent material had an average particle diameter of 5 μm.

Compositional Analysis of YAG Fluorescent Material

The resulting YAG fluorescent material was measured for the pass percentages (% by mass) of the elements (Y, Gd, Ce, and Al) other than oxygen constituting the YAG fluorescent material by an ICP-AES (inductive coupled plasma atomic emission spectrometry) equipment (produced by PerkinElmer, Inc.), and the molar proportions of the elements in the composition of the YAG fluorescent material were calculated from the values of the mass percentages of the elements. The molar ratio of Y, Gd, and Ce were calculated under assumption that the measured molar ratio of Al was 5, and expressed as a value based on the molar ratio of Al of 5. The term "molar ratio" refers to the molar amount of an element in one mole of the chemical composition of the fluorescent material. The compositional ratio of the YAG fluorescent material was $(Y_{0.575}Gd_{0.400}Ce_{0.025})_3Al_5O_{12}$.

Example 23

Step of Mixing Powders 10 parts by mass of the YAG fluorescent material represented by $(Y_{0.575}Gd_{0.400}Ce_{0.025})_3Al_5O_{12}$ having an average particle diameter of 5 μm measured by the FSSS method (i.e., 10% by mass with respect to 100% by mass of mixed powder for forming a green body), 3 parts by mass of a Ca-α-SiAlON fluorescent material having an average particle diameter of 13.0 μm measured by the laser diffractive scattering particle size distribution measuring method (product name: Alonbright, type: YL-600, produced by Denka Co., Ltd.) (i.e., 3% by mass of the Ca-α-SiAlON fluorescent material to 100% by mass of a mixed powder for forming a green body), and 87 parts by mass of α-alumina particles having an average particle diameter of 0.5 μm measured by the FSSS method (product name: AA03, produced by Sumitomo Chemical Co., Ltd., alumina purity: 99.5% by mass) were weighed and mixed by using a mortar and a pestle, so as to prepare the mixed powder for forming a green body. In Tables 4 to 8, the content (% by mass) of the Ca-α-SiAlON fluorescent material shows the mass ratio of the Ca-α-SiAlON fluorescent material during preparation to 100% by mass of the mixed powder for forming a green body. In Tables 4 to 8, the content (% by mass) of the YAG fluorescent material shows the mass ratio of the YAG fluorescent material during preparation to 100% by mass of the mixed powder for forming a green body. In Tables 4 to 8, the content of the alumina particles in Examples and Comparative Examples shows the balance obtained by subtracting the content (% by mass) of the Ca-α-SiAlON fluorescent material and the content (% by mass) of the YAG fluorescent material from 100% by mass of the mixed powder for forming a green body.

Step of Providing Green Body

The mixed powder for forming a green body was charged in a mold, and a green body having a cylinder shape having a diameter of 17.0 mm and a thickness of 10 mm was formed under a pressure of 4.6 MPa (46.9 kgf/cm$^2$). The resulting green body was placed in a packaging container, which was then vacuumed, and the green body was subjected to a cold isostatic pressing process (CIP process) with a CIP equipment (produced by Kobe Steel, Ltd.) with water as a pressure medium at 176 MPa.

Step of Primarily Sintering

The resulting green body was primarily sintered by retaining in a sintering furnace (manufactured by Fujidempa Kogyo Co., Ltd.) in a nitrogen atmosphere (nitrogen: 99% by volume or more) under 0.9 MPa at a temperature of 1,300° C. for 6 hours, so as to provide a first sintered body. The resulting first sintered body was designated as a wavelength converting member of Example 23. In Examples 23 to 41, the content of the Ca-α-SiAlON fluorescent material (% by mass) in the wavelength converting member formed of the first sintered body is substantially the same as the mass ratio during preparation of the Ca-α-SiAlON fluorescent material to 100% by mass of the mixed powder for forming a green body, and the content of the YAG fluorescent material (% by mass) therein is substantially the same as the mass ratio during preparation of the YAG fluorescent material to 100% by mass of the mixed powder for forming a green body. In Comparative Examples 6 to 9, the content of the YAG fluorescent material (% by mass) in the first sintered body is substantially the same as the mass ratio during preparation of the YAG fluorescent material to 100% by mass of the mixed powder for forming a green body.

Example 24

A first sintered body was obtained in the same manner as in Example 23 except that the sintering temperature in the primarily sintering step was changed to 1,400° C., and the resulting first sintered body was designated as a wavelength converting member of Example 24.

Example 25

A first sintered body was obtained in the same manner as in Example 23 except that the sintering temperature in the primarily sintering step was changed to 1,450° C., and the resulting first sintered body was designated as a wavelength converting member of Example 25.

Example 26

A first sintered body was obtained in the same manner as in Example 23 except that the sintering temperature in the primarily sintering step was changed to 1,500° C., and the resulting first sintered body was designated as a wavelength converting member of Example 26.

Example 27

A first sintered body was obtained in the same manner as in Example 25 except that mixed powder for forming the green body obtained by mixing 5 parts by mass of the YAG fluorescent material, 1 part by mass of the Ca-α-SiAlON fluorescent material, and 94 parts by mass of the α-alumina particles was prepared, and the resulting first sintered body was designated as a wavelength converting member of Example 27.

Example 28

A first sintered body was obtained in the same manner as in Example 27 except that the amount of the YAG fluorescent material was 5 parts by mass, the amount of the Ca-α-SiAlON fluorescent material was 3 parts by mass, and the amount of the α-alumina particles was 92 parts by mass, and the resulting first sintered body was designated as a wavelength converting member of Example 28.

Example 29

A first sintered body was obtained in the same manner as in Example 27 except that the amount of the YAG fluorescent material was 5 parts by mass, the amount of the Ca-α-SiAlON fluorescent material was 10 parts by mass, and the amount of the α-alumina particles was 85 parts by mass, and the resulting first sintered body was designated as a wavelength converting member of Example 29.

Example 30

A first sintered body was obtained in the same manner as in Example 27 except that mixed powder for forming the green body obtained by mixing 5 parts by mass of the YAG fluorescent material, 20 part by mass of the Ca-α-SiAlON fluorescent material, and 75 parts by mass of the α-alumina particles was prepared, and the resulting first sintered body was designated as a wavelength converting member of Example 30.

Comparative Example 6

A first sintered body was obtained in the same manner as in Example 27 except that the amount of the YAG fluorescent material was 5 parts by mass, and the amount of the α-alumina particles was 95 parts by mass, and the resulting first sintered body was designated as a wavelength converting member of Comparative Example 6. The wavelength converting member of Comparative Example 6 did not contain the Ca-α-SiAlON fluorescent material.

Example 31

A first sintered body was obtained in the same manner as in Example 25 except that mixed powder for forming the green body obtained by mixing 10 parts by mass of the YAG fluorescent material, 1 part by mass of the Ca-α-SiAlON fluorescent material, and 89 parts by mass of the α-alumina particles was prepared, and the resulting first sintered body was designated as a wavelength converting member of Example 31.

Example 32

A first sintered body was obtained in the same manner as in Example 31 except that the amount of the YAG fluorescent material was 10 parts by mass, the amount of the Ca-α-SiAlON fluorescent material was 10 part by mass, and the amount of the α-alumina particles was 80 parts by mass, and the resulting first sintered body was designated as a wavelength converting member of Example 32.

Example 33

A first sintered body was obtained in the same manner as in Example 31 except that the amount of the YAG fluorescent material was 10 parts by mass, the amount of the Ca-α-SiAlON fluorescent material was 20 part by mass, and the amount of the α-alumina particles was 70 parts by mass, and the resulting first sintered body was designated as a wavelength converting member of Example 33.

Comparative Example 7

A first sintered body was obtained in the same manner as in Example 31 except that the amount of the YAG fluorescent material was 10 parts by mass, and the amount of the α-alumina particles was 90 parts by mass, and the resulting first sintered body was designated as a wavelength converting member of Comparative Example 7. The wavelength converting member of Comparative Example 7 did not contain the Ca-α-SiAlON fluorescent material.

Example 34

A first sintered body was obtained in the same manner as in Example 25 except that mixed powder for forming the green body obtained by mixing 20 parts by mass of the YAG fluorescent material, 1 part by mass of the Ca-α-SiAlON fluorescent material, and 79 parts by mass of the α-alumina particles was prepared, and the resulting first sintered body was designated as a wavelength converting member of Example 34.

Example 35

A first sintered body was obtained in the same manner as in Example 34 except that mixed powder for forming the green body obtained by mixing 20 parts by mass of the YAG fluorescent material, 3 parts by mass of the Ca-α-SiAlON fluorescent material, and 77 parts by mass of the α-alumina particles was prepared, and the resulting first sintered body was designated as a wavelength converting member of Example 35.

Example 36

A first sintered body was obtained in the same manner as in Example 34 except that the amount of the YAG fluorescent material was 20 parts by mass, the amount of the Ca-α-SiAlON fluorescent material was 10 part by mass, and the amount of the α-alumina particles was 70 parts by mass, and the resulting first sintered body was designated as a wavelength converting member of Example 36.

Example 37

A first sintered body was obtained in the same manner as in Example 34 except that the amount of the YAG fluorescent material was 20 parts by mass, the amount of the Ca-α-SiAlON fluorescent material was 20 part by mass, and the amount of the α-alumina particles was 60 parts by mass, and the resulting first sintered body was designated as a wavelength converting member of Example 37.

Comparative Example 8

A first sintered body was obtained in the same manner as in Example 34 except that the amount of the YAG fluorescent material was 20 parts by mass, and the amount of the α-alumina particles was 80 parts by mass, and the resulting first sintered body was designated as a wavelength converting member of Comparative Example 8. The wavelength converting member of Comparative Example 8 did not contain the Ca-α-SiAlON fluorescent material.

Example 38

A first sintered body was obtained in the same manner as in Example 25 except that mixed powder for forming the green body obtained by mixing 30 parts by mass of the YAG fluorescent material, 1 part by mass of the Ca-α-SiAlON fluorescent material, and 69 parts by mass of the α-alumina particles was prepared, and the resulting first sintered body was designated as a wavelength converting member of Example 38.

Example 39

A first sintered body was obtained in the same manner as in Example 38 except that the amount of the YAG fluorescent material was 30 parts by mass, the amount of the Ca-α-SiAlON fluorescent material was 3 part by mass, and the amount of the α-alumina particles was 67 parts by mass, and the resulting first sintered body was designated as a wavelength converting member of Example 39.

Example 40

A first sintered body was obtained in the same manner as in Example 38 except that the amount of the YAG fluorescent material was 30 parts by mass, the amount of the Ca-α-SiAlON fluorescent material was 10 part by mass, and the amount of the α-alumina particles was 60 parts by mass, and the resulting first sintered body was designated as a wavelength converting member of Example 40.

Example 41

A first sintered body was obtained in the same manner as in Example 38 except that the amount of the YAG fluorescent material was 30 parts by mass, the amount of the Ca-α-SiAlON fluorescent material was 20 part by mass, and the amount of the α-alumina particles was 50 parts by mass, and the resulting first sintered body was designated as a wavelength converting member of Example 41.

Comparative Example 9

A first sintered body was obtained in the same manner as in Example 38 except that the amount of the YAG fluorescent material was 30 parts by mass, and the amount of the α-alumina particles was 70 parts by mass, and the resulting first sintered body was designated as a wavelength converting member of Comparative Example 9. The wavelength converting member of Comparative Example 9 did not contain the Ca-α-SiAlON fluorescent material.

Measurement of Relative Density of First Sintered Bodies

In Examples 23 to 41 and Comparative Examples 6 to 9, the first sintered bodies were measured for the relative density using Equations below. The relative densities of the first sintered bodies of Examples 23 to 26 are shown in Table 4. The relative densities of the first sintered bodies of Examples 27 to 30 and Comparative Example 6 are shown in Table 5. The relative densities of the first sintered bodies of Examples 31 to 33 and Comparative Example 7 are shown in Table 6. The relative densities of the first sintered bodies of Examples 34 to 37 and Comparative Example 8 are shown in Table 7. The relative densities of the first sintered bodies of Examples 38 to 41 and Comparative Example 9 are shown in Table 8.

The relative density was calculated using Equation (1).

The relative density (%)=((the apparent density of the first sintered body)/(the true density of the first sintered body))×100  (1)

The true density of the first sintered body was calculated using Equation (2-2). The true density of the α-alumina particles used in Examples and Comparative Examples was assumed to be 3.98 g/cm$^3$. The true density of the Ca-α-SiAlON fluorescent material used therein was assumed to be 3.22 g/cm$^3$. The true density of the YAG fluorescent material used therein was assumed to be 4.77 g/cm$^3$. The true density of the YAG fluorescent material was measured by using a dry automatic densitometer (AccuPyc 1330, a trade name, manufactured by Shimadzu Corporation).

The true density of the first sintered body=((the mass proportion of the Ca-α-SiAlON fluorescent material to 100% by mass of the mixed powder for the green body)×(the true density of the Ca-α-SiAlON fluorescent material))+((the mass ratio of the YAG fluorescent material to 100% by mass of the mixed powder for the green body)×(the true density of the YAG fluorescent material))+((the mass ratio of alumina particles to 100% by mass of the mixed powder for the green body)×(the true density of alumina particles))  (2-2)

The apparent density of the first sintered body was calculated using Equation (3).

The apparent density of the first sintered body=(the mass of the first sintered body)/(the volume of first sintered body obtained by Archimedes' method)  (3)

Measurement of Relative Emission Intensity and Chromaticity

The wavelength converting members formed of the first sintered bodies of Examples and Comparative Examples each were cut to a thickness of 300 μm with a wire saw to prepare specimens. By using an LED chip formed of a nitride semiconductor having an emission peak wavelength of 455 nm as a light source, the specimens of the wavelength converting members each were irradiated with light from the light source, and the emission intensities and the chromaticities (x value, y value on the CIE chromaticity coordinate) of the emission peak wavelength within a wavelength range of 430 nm or more and 800 nm or less obtained from each of the specimens by receiving the light from the light source were measured with a spectrofluorophotometer. Some of the wavelength converting members that had a relative density exceeding 90% passed the blue light emitted from the light source. The chromaticities of the Examples 23 to 41 and Comparative Examples 6 to 9 each were the chromaticity (x value, y value) obtained by measuring the emission spectrum obtained from the specimen within a wavelength range of 430 nm or more and 800 nm or less, from which the emission spectrum of the blue light in a range of 490 nm or less was excluded.

The relative emission intensities and the chromaticities (x value, y value) of the first sintered bodies as the wavelength converting members of Examples 23 to 26 are shown in Table 4. The emission intensity of the first sintered body of Example 25 having a relative density that is closest to 90% among the first sintered bodies of Examples 23 to 26 is assumed to be 100%, and the emission intensities of the first sintered bodies of Examples 23 to 26 each are shown as a relative emission intensity (%).

The relative emission intensities and the chromaticities (x value, y value) of the first sintered bodies as the wavelength converting members of Examples 27 to 30 and Comparative Example 6 are shown in Table 5. The emission intensity of the first sintered body of Example 30 having a relative density that is closest to 90% among the first sintered bodies of Examples 27 to 30 and Comparative Example 6 is assumed to be 100%, and the emission intensities of the first sintered bodies of Examples 27 to 30 and Comparative Example 6 each are shown as a relative emission intensity (%).

The relative emission intensities and the chromaticities (x value, y value) of the first sintered bodies as the wavelength converting members of Examples 31 to 33 and Comparative Example 7 are shown in Table 6. The emission intensity of the first sintered body of Example 33 having a relative density that is closest to 90% among the first sintered bodies of Examples 31 to 33 and Comparative Example 7 is assumed to be 100%, and the emission intensities of the first sintered bodies of Examples 31 to 33 and Comparative Example 7 each are shown as a relative emission intensity (%).

The relative emission intensities and the chromaticities (x value, y value) of the first sintered bodies as the wavelength converting members of Examples 34 to 37 and Comparative Example 8 are shown in Table 7. The emission intensity of the first sintered body of Example 37 having a relative density that is closest to 90% among the first sintered bodies of Examples 34 to 37 and Comparative Example 8 is assumed to be 100%, and the emission intensities of the first sintered bodies of Examples 34 to 37 and Comparative Example 8 each are shown as a relative emission intensity (%).

The relative emission intensities and the chromaticities (x value, y value) of the first sintered bodies as the wavelength converting members of Examples 38 to 41 and Comparative Example 9 are shown in Table 8. The emission intensity of the first sintered body of Example 40 having a relative density that is closest to 90% among the first sintered bodies of Examples 38 to 41 and Comparative Example 9 is assumed to be 100%, and the emission intensities of the first sintered bodies of Examples 38 to 41 and Comparative Example 9 each are shown as a relative emission intensity (%).

Figure 6:
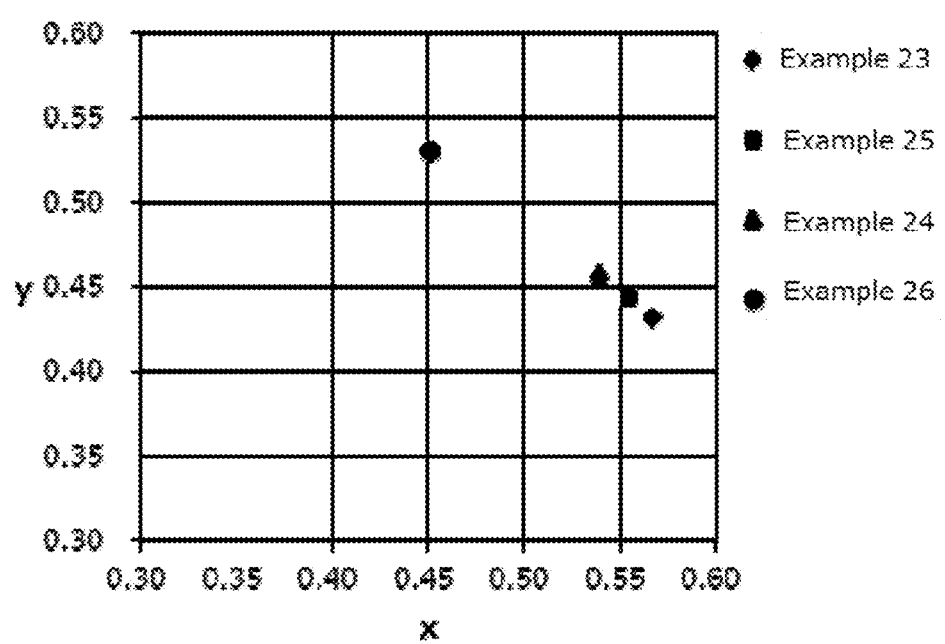
FIG. 6 is a diagram showing the chromaticities (x value, y value) on the CIE chromaticity coordinate of the wavelength converting members of Examples 23 to 26.
Figure 7:
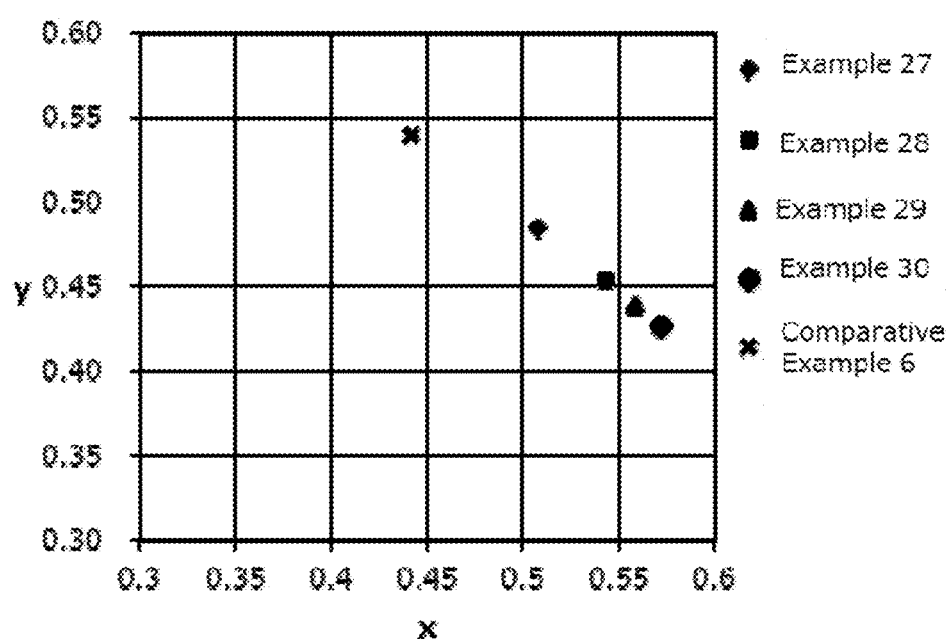
FIG. 7 is a diagram showing the chromaticities (x value, y value) on the CIE chromaticity coordinate of the wavelength converting members of Examples 27 to 30 and the first sintered body of Comparative Example 6.

FIG. 6 is a diagram showing the chromaticities (x value, y value) of the wavelength converting members formed of the first sintered bodies of Examples 23 to 26 plotted on the CIE chromaticity coordinate. FIG. 7 is a diagram showing the chromaticities (x value, y value) of the wavelength converting members formed of the first sintered bodies of Examples 27 to 30 and the first sintered body of Comparative Example 6 plotted on the CIE chromaticity coordinate.

TABLE 4

|  | Content of fluorescent material (% by mass) | | Sintering temperature (° C.) | Wavelength converting member | | | |
|---|---|---|---|---|---|---|---|
|  | YAG | Ca-α-SiAlON |  | Relative density (%) | Relative emission intensity (%) | Chromaticity | |
|  |  |  |  |  |  | x value | y value |
| Example 23 | 10 | 3 | 1300 | 70.0 | 15.4 | 0.567 | 0.432 |
| Example 24 | 10 | 3 | 1400 | 79.7 | 38.5 | 0.555 | 0.443 |
| Example 25 | 10 | 3 | 1450 | 90.4 | 100.0 | 0.537 | 0.458 |
| Example 26 | 10 | 3 | 1500 | 93.1 | 615.4 | 0.451 | 0.530 |

As shown in Table 4, the wavelength converting members of Examples 23 to 26 were formed of the first sintered bodies obtained by changing the temperature of the primary sintering in a range of 1,300° C. to 1,500° C., and with the higher temperature of the primary sintering, the relative intensity was increased, and the relative emission intensity was increased.

As shown in Table 4 and FIG. 6, the wavelength converting member of Example 26 had the chromaticity that was shifted to the short wavelength side as compared to the wavelength converting members of Examples 23 to 25. The wavelength converting member of Example 26 clearly passed the blue light emitted from the light source due to the high relative density thereof of 93.1%. While the chromaticities (x value, y value) of Examples shown in FIG. 6 were chromaticities measured after excluding the blue light emitted from the light source, it was estimated that the reason why the chromaticity of the wavelength converting member of Example 26 was shifted to the short wavelength side was that since the temperature of the primary sintering was as relatively high as 1,500° C., the crystal structure of the Ca-α-SiAlON fluorescent material was partially decomposed and deteriorated due to the compound containing, for example, fluorine contained in a slight amount in the YAG fluorescent material, and only the YAG fluorescent material emitted light under irradiation of the excitation light.

TABLE 5

|  | Content of fluorescent material (% by mass) | | Sintering temperature (° C.) | Wavelength converting member | | | |
|---|---|---|---|---|---|---|---|
|  | YAG | Ca-α-SiAlON |  | Relative density (%) | Relative emission intensity (%) | Chromaticity | |
|  |  |  |  |  |  | x value | y value |
| Example 27 | 5 | 1 | 1450 | 87.0 | 28.0 | 0.508 | 0.484 |
| Example 28 | 5 | 3 | 1450 | 89.4 | 34.8 | 0.543 | 0.453 |
| Example 29 | 5 | 10 | 1450 | 92.7 | 108.7 | 0.559 | 0.439 |

TABLE 5-continued

|  | Content of fluorescent material (% by mass) | | Sintering temperature | Wavelength converting member | | Chromaticity | |
|---|---|---|---|---|---|---|---|
|  | | | | Relative density | Relative emission intensity | | |
|  | YAG | Ca-α-SiAlON | (° C.) | (%) | (%) | x value | y value |
| Example 30 | 5 | 20 | 1450 | 89.8 | 100.0 | 0.572 | 0.427 |
| Comparative Example 6 | 5 | 0 | 1450 | 90.3 | 72.2 | 0.442 | 0.539 |

As shown in Table 5, in the wavelength converting members of Example 27 to 30, in the case where the content of the YAG fluorescent material was 5% by mass, the relative density and the relative emission intensity were increased when the amount of the Ca-α-SiAlON fluorescent material was increased in a range of from 1 to 10% by mass. In the case where the total content of the Ca-α-SiAlON fluorescent material and the YAG fluorescent material was in a range of 0.1% by mass or more and 70% by mass or less, and the content of the Ca-α-SiAlON fluorescent material was in the range of 0.1% by mass or more and 40% by mass or less, as in the wavelength converting members of Example 27 to 30, the wavelength converting members had a relative density of 80% or more, emitted light having an emission peak wavelength within a wavelength range of 430 nm or more and 800 nm or less under irradiation of the excitation light having an emission peak wavelength of 455 nm, and thus was capable of being used as a wavelength converting member.

As shown in Table 5 and FIG. 7, the wavelength converting members of Example 27 to 30 emitted light having an emission peak wavelength within a wavelength range of 430 nm or more and 800 nm or less and a chromaticity on the long wavelength side as compared to Comparative Example 6, under irradiation of the excitation light having an emission peak wavelength of 455 nm, and thus was capable of being used as a wavelength converting member emitting in a desired color tone.

The wavelength converting member of Comparative Example 6 clearly passed the blue light emitted from the light source due to the high relative density thereof of 90.3%. While the chromaticities (x value, y value) of Examples and Comparative Examples shown in Table 5 and FIG. 7 were chromaticities measured after excluding the blue light emitted from the light source, the first sintered body of Comparative Example 6 did not contain the Ca-α-SiAlON fluorescent material, and thus emitted light having a chromaticity (x value, y value) on the short wavelength side as compared to the wavelength converting members formed of the first sintered bodies of Examples 27 to 30.

TABLE 6

|  | Content of fluorescent material (% by mass) | | Sintering temperature | Wavelength converting member | | Chromaticity | |
|---|---|---|---|---|---|---|---|
|  | | | | Relative density | Relative emission intensity | | |
|  | YAG | Ca-α-SiAlON | (° C.) | (%) | (%) | x value | y value |
| Example 31 | 10 | 1 | 1450 | 85.9 | 21.2 | 0.507 | 0.485 |
| Example 32 | 10 | 10 | 1450 | 91.6 | 85.8 | 0.555 | 0.443 |
| Example 33 | 10 | 20 | 1450 | 88.7 | 100.0 | 0.571 | 0.428 |
| Comparative Example 7 | 10 | 0 | 1450 | 88.7 | 62.8 | 0.453 | 0.532 |

As shown in Table 6, in the wavelength converting members of Example 31 to 33, in the case where the content of the YAG fluorescent material was 10% by mass, the relative density and the relative emission intensity were increased when the amount of the Ca-α-SiAlON fluorescent material was increased in a range of from 1 to 20% by mass. In the case where the total content of the Ca-α-SiAlON fluorescent material and the YAG fluorescent material was in a range of 0.1% by mass or more and 70% by mass or less, and the content of the Ca-α-SiAlON fluorescent material was in the range of 0.1% by mass or more and 40% by mass or less, as in the wavelength converting members of Example 31 to 33, the wavelength converting members had a relative density of 80% or more, emitted light having an emission peak wavelength within a wavelength range of 430 nm or more and 800 nm or less under irradiation of the excitation light having an emission peak wavelength of 455 nm, emitted light having a chromaticity on the long wavelength side as compared to Comparative Example 7, and thus was capable of being used as a wavelength converting member emitting in a desired color tone.

As shown in Table 6, the first sintered body of Comparative Example 7 did not contain the Ca-α-SiAlON fluorescent material, and thus emitted light having a chromaticity (x value, y value) on the short wavelength side as compared to the wavelength converting members formed of the first sintered bodies of Examples 31 to 33.

TABLE 7

| | Content of fluorescent material (% by mass) | | Sintering temperature | Wavelength converting member | | | |
|---|---|---|---|---|---|---|---|
| | | | | Relative density | Relative emission intensity | Chromaticity | |
| | YAG | Ca-α-SiAlON | (° C.) | (%) | (%) | x value | y value |
| Example 34 | 20 | 1 | 1450 | 85.3 | 13.6 | 0.515 | 0.479 |
| Example 35 | 20 | 3 | 1450 | 88.5 | 19.9 | 0.536 | 0.459 |
| Example 36 | 20 | 10 | 1450 | 92.0 | 105.7 | 0.546 | 0.451 |
| Example 37 | 20 | 20 | 1450 | 89.3 | 100.0 | 0.565 | 0.433 |
| Comparative Example 8 | 20 | 0 | 1450 | 87.8 | 57.0 | 0.469 | 0.520 |

As shown in Table 7, in the wavelength converting members of Example 34 to 37, in the case where the content of the YAG fluorescent material was 20% by mass, the relative density and the relative emission intensity were increased when the amount of the Ca-α-SiAlON fluorescent material was increased in a range of from 1 to 10% by mass. In the case where the total content of the Ca-α-SiAlON fluorescent material and the YAG fluorescent material was in a range of 0.1% by mass or more and 70% by mass or less, and the content of the Ca-α-SiAlON fluorescent material was in the range of 0.1% by mass or more and 40% by mass or less, as in the wavelength converting members of Example 34 to 37, the wavelength converting members had a relative density of 80% or more, emitted light having an emission peak wavelength within a wavelength range of 430 nm or more and 800 nm or less under irradiation of the excitation light having an emission peak wavelength of 455 nm, emitted light having a chromaticity on the long wavelength side as compared to Comparative Example 8, and thus was capable of being used as a wavelength converting member emitting in a desired color tone.

As shown in Table 7, the first sintered body of Comparative Example 8 did not contain the Ca-α-SiAlON fluorescent material, and thus emitted light having a chromaticity (x value, y value) on the short wavelength side as compared to the wavelength converting members formed of the first sintered bodies of Examples 34 to 37.

TABLE 8

| | Content of fluorescent material (% by mass) | | Sintering temperature | Wavelength converting member | | | |
|---|---|---|---|---|---|---|---|
| | | | | Relative density | Relative emission intensity | Chromaticity | |
| | YAG | Ca-α-SiAlON | (° C.) | (%) | (%) | x value | y value |
| Example 38 | 30 | 1 | 1450 | 84.1 | 9.5 | 0.525 | 0.468 |
| Example 39 | 30 | 3 | 1450 | 87.6 | 16.7 | 0.538 | 0.458 |
| Example 40 | 30 | 10 | 1450 | 91.1 | 100.0 | 0.547 | 0.450 |

TABLE 8-continued

| | Content of fluorescent material (% by mass) | | Wavelength converting member | | | | |
|---|---|---|---|---|---|---|---|
| | | | Sintering temperature | Relative density | Relative emission intensity | Chromaticity | |
| | YAG | Ca-α-SiAlON | (° C.) | (%) | (%) | x value | y value |
| Example 41 | 30 | 20 | 1450 | 88.4 | 107.7 | 0.563 | 0.435 |
| Comparative Example 9 | 30 | 0 | 1450 | 85.4 | 42.2 | 0.483 | 0.509 |

As shown in Table 8, in the wavelength converting members of Example 38 to 41, in the case where the content of the YAG fluorescent material was 30% by mass, the relative density was increased when the amount of the Ca-α-SiAlON fluorescent material was increased in a range of from 1 to 10% by mass. Furthermore, in the wavelength converting members of Example 38 to 41, in the case where the content of the YAG fluorescent material was 30% by mass, the relative emission intensity was increased when the amount of the Ca-α-SiAlON fluorescent material was increased in a range of from 1 to 20% by mass. In the case where the total content of the Ca-α-SiAlON fluorescent material and the YAG fluorescent material was in a range of 0.1% by mass or more and 70% by mass or less, and the content of the Ca-α-SiAlON fluorescent material was in the range of 0.1% by mass or more and 40% by mass or less, as in the wavelength converting members of Example 38 to 41, the wavelength converting members had a relative density of 80% or more, emitted light having an emission peak wavelength within a wavelength range of 430 nm or more and 800 nm or less under irradiation of the excitation light having an emission peak wavelength of 455 nm and having a chromaticity on the long wavelength side as compared to Comparative Example 9, and thus was capable of being used as a wavelength converting member emitting in a desired color tone.

As shown in Table 8, the first sintered body of Comparative Example 9 did not contain the Ca-α-SiAlON fluorescent material, and thus emitted light having a chromaticity (x value, y value) on the short wavelength side as compared to the wavelength converting members formed of the first sintered bodies of Examples 38 to 41.

The wavelength converting member according to the disclosure herein emits light under irradiation of excitation light, and can be utilized as a wavelength converting member capable of converting the wavelength of light emitted from an LED or an LD, and a material for a solid scintillator.

The invention claimed is:

1. A method for producing a wavelength converting member, comprising:
providing a green body prepared by a process comprising molding a mixed powder comprising a Ca-α-SiAlON fluorescent material and alumina; and
primarily sintering the green body at a temperature in a range of 1,500° C. or more and 1,550° C. or less to obtain a first sintered body in an atmosphere containing 99% by volume or more nitrogen gas,
wherein the mixed powder contains the Ca-α-SiAlON fluorescent material in a content in a range of 0.1% by mass or more and 40% by mass or less with respect to 100% by mass of the mixed powder, and
wherein the Ca-α-SiAlON fluorescent material is represented by the following formula (II):

$$M_k Si_{12-(m+n)} Al_{m+n} O_n N_{16-n} : Eu \qquad (II)$$

wherein in the formula, M is at least one element selected form the group consisting of Li, Mg, Ca, Sr, Y and lanthanoid elements excluding La and Ce, and k, m and n satisfy $0 < k \le 2.0$, $2.0 \le m \le 6.0$, $0 \le n \le 1.0$, wherein molding the mixed powder comprises using a combination of a press molding first and then a cold isostatic pressing (CIP), and wherein a pressure in the press molding is 3 MPa to 50 MPa and a pressure in the cold isostatic pressing (CIP) is 50 MPa to 250 MPa.

2. The method for producing a wavelength converting member according to claim 1, wherein the method further comprises secondarily sintering the first sintered body by applying a hot isostatic pressing (HIP) treatment at a temperature in a range of 1,000° C. or more and 1,600° C. or less to obtain a second sintered body.

3. The method for producing a wavelength converting member according to claim 2, wherein the second sintered body has a relative density of 90% or more, and wherein the relative density of the second sintered body is a value calculated by an apparent density of the second sintered body with respect to a true density of the second sintered body.

4. The method for producing a wavelength converting member according to claim 1, wherein the Ca-α-SiAlON fluorescent material has an average particle diameter in a range of 2 μm or more and 30 μm or less.

5. The method for producing a wavelength converting member according to claim 1, wherein the alumina has an average particle diameter in a range of 0.1 μm or more and 1.3 μm or less.

6. The method for producing a wavelength converting member according to claim 1, wherein the mixed powder further comprises an yttrium-aluminum-garnet fluorescent material and wherein a total content of the Ca-α-SiAlON fluorescent material and the yttrium-aluminum-garnet fluorescent material is in a range of 0.1% by mass or more and 69.9% by mass or less with respect to 100% by mass of the mixed powder.

7. The method for producing a wavelength converting member according to claim 6, wherein the mixed powder contains the alumina particles in a content in a range of 30% by mass or more and 99.9% by mass or less with respect to 100% by mass of the mixed powder.

8. The method for producing a wavelength converting member according to claim 1, wherein the alumina has an alumina purity of 99.0% by mass or more.

9. The method for producing a wavelength converting member according to claim 1, wherein the first sintered body has a relative density of 80% or more, and wherein the relative density of the first sintered body is a value calculated by an apparent density of the first sintered body with respect to a true density of the first sintered body.

10. The method for producing a wavelength converting member according to claim 1, wherein the second sintered body has a relative density of 90% or more, and wherein the relative density of the second sintered body is a value calculated by an apparent density of the second sintered body with respect to a true density of the second sintered body.

11. The method for producing a wavelength converting member according to claim 1, wherein the mixed powder contains the alumina particles in a content in a range of 60% by mass or more and 99.9% by mass or less with respect to 100% by mass of the mixed powder.

12. The method for producing a wavelength converting member according to claim 1, wherein the primary sintering is performed under an atmosphere containing nitrogen gas and an ambient pressure in a range of 0.8 MPa or more and 200 MPa or less.

13. The method for producing a wavelength converting member according to claim 1, wherein the pressure in the press molding is 4 MPa to 20 MPa.

14. The method for producing a wavelength converting member according to claim 1 wherein the pressure in the cold isostatic pressing (CIP) is 100 MPa to 200 MPa.

* * * * *